US012671436B2

(12) United States Patent
Koo et al.

(10) Patent No.: US 12,671,436 B2
(45) Date of Patent: Jun. 30, 2026

(54) DIGITAL-TO-ANALOG CONVERSION

(71) Applicant: SAMSUNG ELECTRONICS CO., LTD., Suwon-si (KR)

(72) Inventors: Byungwoo Koo, Suwon-si (KR); Sunghan Do, Suwon-si (KR); Sangpil Nam, Suwon-si (KR); Youngjae Cho, Suwon-si (KR); Michael Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 54 days.

(21) Appl. No.: 18/802,014

(22) Filed: Aug. 13, 2024

(65) Prior Publication Data
US 2025/0070794 A1     Feb. 27, 2025

(30) Foreign Application Priority Data

Aug. 23, 2023  (KR) ........................ 10-2023-0110769
Dec. 19, 2023  (KR) ........................ 10-2023-0186301

(51) Int. Cl.
H03M 1/68          (2006.01)

(52) U.S. Cl.
CPC .................................. H03M 1/687 (2013.01)

(58) Field of Classification Search
CPC ............................... H03M 1/687; H03M 1/66
USPC ................................. 341/144, 145, 120, 118
See application file for complete search history.

(56) References Cited

U.S. PATENT DOCUMENTS 2,250,265 A  *  7/1941  Kapp ........................ C10M 3/00
                                                      508/501
7,283,077 B2 *  10/2007  Cho ...................... H03M 1/682
                                                      341/150

9,692,435 B2     6/2017  Chandra et al.
9,735,799 B1 *   8/2017  Nguyen .................. H03M 1/06
10,090,854 B1   10/2018  Clara
10,250,272 B2    4/2019  Zhu (Continued)

FOREIGN PATENT DOCUMENTS

WO      WO 2018103866          6/2018

OTHER PUBLICATIONS

Extended European Search Report in European Appln. No. 24195794.3, mailed on Jan. 23, 2025, 13 pages.

(Continued)

*Primary Examiner* — Peguy Jean Pierre

(74) *Attorney, Agent, or Firm* — Fish & Richardson P.C.

(57)          ABSTRACT

A digital-to-analog converter (DAC) for generating an analog output from a digital input includes a controller configured to generate a control signal based on the digital input, and a segment cell circuit including a plurality of segment cells turned on or off based on the control signal and configured to generate the analog output based on outputs of the plurality of segment cells, wherein the plurality of segment cells include a plurality of first segment cells each configured to generate an output corresponding to each of bits included in a first bit group of the digital input, a plurality of second segment cells each configured to generate an output corresponding to each of bits included in a second bit group of the digital input, and an additional segment cell configured to generate an output corresponding to a lowermost bit among the bits included in the second bit group.

20 Claims, 18 Drawing Sheets

| | Thermometer + Binary | UBs | MBs | AB | LBs |
|---|---|---|---|---|---|
| DI1 | 0000111 111 111111 | 0 0 0 0 1 1 1 | 1 1 1 | 0 | 1 1 1 1 1 1 |
| DI2 (use AB) | 0001111 000 000000 | 0 0 0 0 1 1 1 | 1 1 1 | 1 | 0 0 0 0 0 0 |
| DI2 (not use ABC) | 0001111 000 000000 | 0 0 0 1 1 1 1 | 0 0 0 | – | 0 0 0 0 0 0 |

UB   MB   LB

(56)  References Cited

U.S. PATENT DOCUMENTS

| | | | |
|---|---|---|---|
| 10,693,483 | B1 | 6/2020 | Luo et al. |
| 10,944,419 | B2 | 3/2021 | Zhang |
| 11,637,560 | B2 | 4/2023 | Clara et al. |
| 2008/0036635 | A1 | 2/2008 | Lin |
| 2011/0122008 | A1 | 5/2011 | Mahooti et al. |
| 2023/0198533 | A1 | 6/2023 | Gruber et al. |

OTHER PUBLICATIONS

Koo et al., "A 12-bit 16GS/s Single-Channel RF-DAC with Hybrid Segmentation for Digital Back-Off and Code-Dependent Free Switch Driver Achieving -85dBc IMD3 in 5nm FinFET," IEEE Symposium on VLSI Technology and Circuits (VLSI Technology and Circuits), IEEE, Jun. 16, 2024, 2 pages.

\* cited by examiner

FIG. 3C

| | Binary | UBCs | LBCs | ABC |
|---|---|---|---|---|
| DI1 | 011 111111 | 0 1 1 | 1 1 1 1 1 1 | 0 |
| DI2 (use ABC) | 100 000000 | 0 1 1 | 1 1 1 1 1 1 | 1 |
| DI2 (not use ABC) | 100 000000 | 1 0 0 | 0 0 0 0 0 0 | – |

| | Thermometer + Binary | UBs | LBs | AB |
|---|---|---|---|---|
| DI1 | 0000111 111111 | 0 0 0 0 1 1 1 | 1 1 1 1 1 1 | 0 |
| DI2 (use ABC) | 0001111 000000 | 0 0 0 0 1 1 1 | 1 1 1 1 1 1 | 1 |
| DI2 (not use ABC) | 0001111 000000 | 0 0 0 1 1 1 1 | 0 0 0 0 0 0 | – |

|  | Thermometer + Binary | UBs | MBs | AB | LBs |
|---|---|---|---|---|---|
| DI1 | 0000111 111 111111 | 0 0 0 0 1 1 1 | 1 1 1 | 0 | 1 1 1 1 1 1 |
| DI2 (use AB) | 0001111 000 000000 | 0 0 0 0 1 1 1 | 1 1 1 | 1 | 0 0 0 0 0 0 |
| DI2 (not use ABC) | 0001111 000 000000 | 0 0 0 1 1 1 1 | 0 0 0 | – | 0 0 0 0 0 0 |

| UBC1 | UBC2 | |
|---|---|---|
| UBC3 | UBC4 | |
| UBC5 | UBC6 | |

| UBC7 | MBC1 | MBC2 | |
|---|---|---|---|
| | MBC3 | MBC4 | |
| | MBC5 | MBC6 | |
| | MBC7 | ABC | LBCs |

FIG. 6C

|  | Thermometer + Binary | UBs | MBs | AB | LBs |
|---|---|---|---|---|---|
| DI1 | 0000111 1111111 111111 | 0 0 0 0 1 1 1 | 1 1 1 1 1 1 1 | 0 | 1 1 1 1 1 1 |
| DI2 (use AB) | 0001111 0000000 000001 | 0 0 0 0 1 1 1 | 1 1 1 1 1 1 1 | 1 | 0 0 0 0 0 1 |
| DI2 (not use ABC) | 0001111 0000000 000001 | 0 0 0 1 1 1 1 | 0 0 0 0 0 0 0 | – | 0 0 0 0 0 1 |

UB　　MB　　LB

DIGITAL-TO-ANALOG CONVERSION

CROSS-REFERENCE TO RELATED APPLICATIONS

This application claims priority under 35 U.S.C. § 119 to Korean Patent Application No. 10-2023-0110769, filed on Aug. 23, 2023, and Korean Patent Application No. 10-2023-0186301, filed on Dec. 19, 2023, in the Korean Intellectual Property Office, each of which is incorporated by reference herein in its entirety.

BACKGROUND

A communication system such as 5th Generation (5G) performs communication by using Orthogonal Frequency Division Multiplexing (OFDM) in both uplink and downlink and therefore may use very small data sizes in each channel. An electronic device in the communication system may use a DAC to convert a digital signal into an analog signal, and may output the analog signal.

The DAC may convert a digital input into an analog output. In this case, when the size of the digital input into the DAC is small, linearity and dynamic range performance may degrade due even to small errors that occur in the process of converting the digital input into the analog output.

SUMMARY

Some implementations according to this disclosure provide digital-to-analog converters (DAC) that may reduce an error that occurs in a process of converting a digital input into an analog output.

According to some implementations, there is provided a DAC for generating an analog output from a digital input includes a controller configured to generate a control signal based on the digital input, and a segment cell circuit including a plurality of segment cells turned on or off based on the control signal and configured to generate the analog output based on outputs of the plurality of segment cells, wherein the plurality of segment cells include a plurality of first segment cells each configured to generate an output corresponding to each of bits included in a first bit group of the digital input, a plurality of second segment cells each configured to generate an output corresponding to each of bits included in a second bit group of the digital input, and an additional segment cell configured to generate an output corresponding to a lowermost bit among the bits included in the second bit group.

According to some implementations, there is provided a DAC for generating an analog output from a digital input includes a controller configured to generate a control signal based on the digital input, and a segment cell circuit including a plurality of segment cells turned on or off based on the control signal and configured to generate the analog output based on outputs of the plurality of segment cells, wherein the plurality of segment cells include a plurality of first segment cells each configured to generate an output corresponding to each of bits included in a first bit group of the digital input, a plurality of second segment cells each configured to generate an output corresponding to each of bits included in a second bit group of the digital input, a plurality of third segment cells each configured to generate an output corresponding to each of bits included in a third bit group of the digital input, and an additional segment cell configured to generate an output corresponding to a lowermost bit among the bits included in the second bit group.

According to some implementations, there is provided an operating method of a DAC for generating an analog output from a digital input includes receiving the digital input, generating a control signal based on the digital input, and turning on or off a plurality of segment cells based on the control signal, wherein the plurality of segment cells include a plurality of first segment cells each configured to generate an output corresponding to each of bits included in a first bit group of the digital input, a plurality of second segment cells each configured to generate an output corresponding to each of bits included in a second bit group of the digital input, and an additional segment cell configured to generate an output corresponding to a lowermost bit among the bits included in the second bit group.

BRIEF DESCRIPTION OF THE DRAWINGS

Implementations according to the present disclosure will be more clearly understood from the following detailed description taken in conjunction with the accompanying drawings in which:

FIG. 3C is a table illustrating an example of the state of a plurality of segment cells corresponding to a digital input into a DAC having the segment cell circuit structure of FIG. 3A;

FIG. 4B is a diagram illustrating a structure of a plurality of segment cells corresponding to the segment cell circuit of FIG. 4A;

FIG. 4C is a table illustrating an example of the state of a plurality of segment cells corresponding to a digital input into a DAC having the segment cell circuit structure of FIG. 4A;

FIG. 5B is a diagram illustrating a structure of a plurality of segment cells corresponding to the segment cell circuit of FIG. 5A;

FIG. 5C is a table illustrating an example of the state of a plurality of segment cells corresponding to a digital input into a DAC having the segment cell circuit structure of FIG. 5A;

FIG. 6B is a diagram illustrating a structure of a plurality of segment cells corresponding to the segment cell circuit of FIG. 6A;

FIG. 6C is a table illustrating an example of the state of a plurality of segment cells corresponding to a digital input into a DAC having the segment cell circuit structure of FIG. 6A;

DETAILED DESCRIPTION

Figure 1:
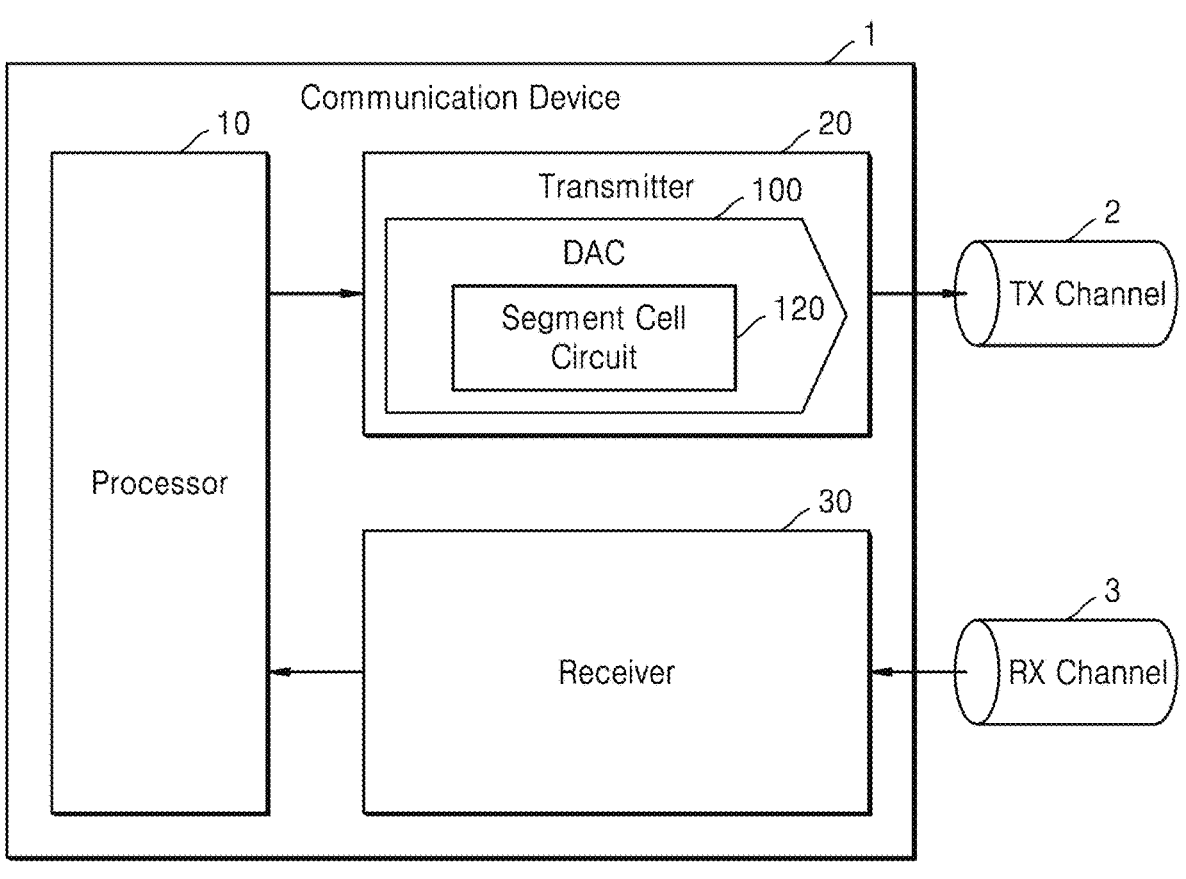
FIG. 1 is a block diagram illustrating an example of a communication device.

FIG. 1 is a block diagram illustrating a communication device. Referring to FIG. 1, a communication device 1 may include a processor 10, a transmitter 20, and a receiver 30.

In some implementations, the communication device 1 is a communication device capable of supporting 5th Generation (5G) communication, Long Term Evolution (LTE) communication, Code Division Multiple Access (CDMA) communication, Global System for Mobile Communications (GSM) communication, Wireless Local Area Network (WLAN) communication, or next-generation communication. However, the communication device 1 is not limited thereto For example, in some implementations, the communication device 1 may include at least one of a smart phone, tablet personal computer (PC), mobile phone, video phone, e-book reader, desktop PC, laptop PC, netbook computer, personal digital assistant (PDA), portable multimedia player (PMP), MP3 player, mobile medical device, camera, or wearable device (e.g., head-mounted-device (HMD) such as electronic glasses, electronic clothing, electronic bracelet, electronic necklace, electronic appcessories, electronic tattoos, or smart watches).

In some implementations, the communication device 1 is a smart home appliance with an image display function. The smart home appliance may include, for example, at least one of a television (TVs), digital video disk (DVD) player, audio device, refrigerator, air conditioner, cleaner, oven, microwave oven, washing machine, air cleaner, set-top box, TV box (e.g., Samsung HomeSync, Apple TV, or Google TV), game console, electronic dictionary, electronic key, camcorder, or electronic picture frame.

In some implementations, the communication device 1 includes at least one of various medical devices (e.g., magnetic resonance angiography (MRA) devices, magnetic resonance imaging (MRI) devices, computed tomography (CT) devices, imaging devices, ultrasound devices, and the like), navigation devices, global positioning system (GPS) receivers, event data recorders (EDRs), flight data recorders (FDRs), vehicle infotainment devices, marine electronic equipment (e.g., marine navigation systems, gyro compasses, and the like), avionics, security devices, vehicle head units, industrial or home robots, automatic teller's machines (ATMs) of financial institutions, or points-of-sale (POSs) of stores.

In some implementations, the communication device 1 includes at least one of a portion of furniture or a building/structure including an image display function, electronic board, electronic signature receiving device, projector, or various measuring devices (e.g., water, electricity, gas, or radio wave measuring devices and the like).

The processor 10 may control the overall operation of the communication device 1 and process data required for the operation. The processor 10 may be a baseband processor.

As an example, the processor 10 may provide a digital input to the transmitter 20 and may receive a digital input from the receiver 30.

The transmitter 20 may transmit a radio frequency (RF) signal to a base station or another device through a transmission (TX) channel 2. The receiver 30 may receive an RF signal from a base station or another device through a reception (RX) channel 3.

In some implementations, the transmitter 20 includes a direct radio frequency (RF) synthesis architecture in which a mixer is omitted, and a digital-to-analog converter (DAC) 100 may generate an analog signal corresponding to the frequency band of an RF signal output from the transmitter 20. For example, the DAC 100 may generate an analog signal in a wide frequency band from a low frequency band to a high frequency band (e.g., a millimeter-wave band). However, this is merely an example, and this disclosure can apply equally to an upconversion architecture or an intermediate frequency architecture. Moreover, the use of the DAC 100 as described herein is not limited to direct RF synthesis architecture but can apply to various RF architectures and other types of devices.

In some implementations, the transmitter 20 and the receiver 30 are implemented as an RF integrated circuit and may include an amplifier, an oscillator, a filter, a frequency divider, and the like necessary for transmitting/receiving RF signals.

In some implementations, the transmitter 20 includes the DAC 100 for generating an analog output from the digital input received from the processor 10.

In some implementations, as described herein the DAC 100 generates an analog output by using a plurality of segment cells, and the plurality of segment cells include additional segment cells, discussed in further detail below. As such, by using an additional segment cell, the DAC 100 may reduce an error occurring in the process of converting a digital input into an analog output, thus improving the linearity and dynamic range performance, e.g., when the size of the digital input is small.

A more detailed structure and operation of the DAC 100 according to some implementations will be described below with reference to FIG. 2 and the following drawings.

Figure 2:
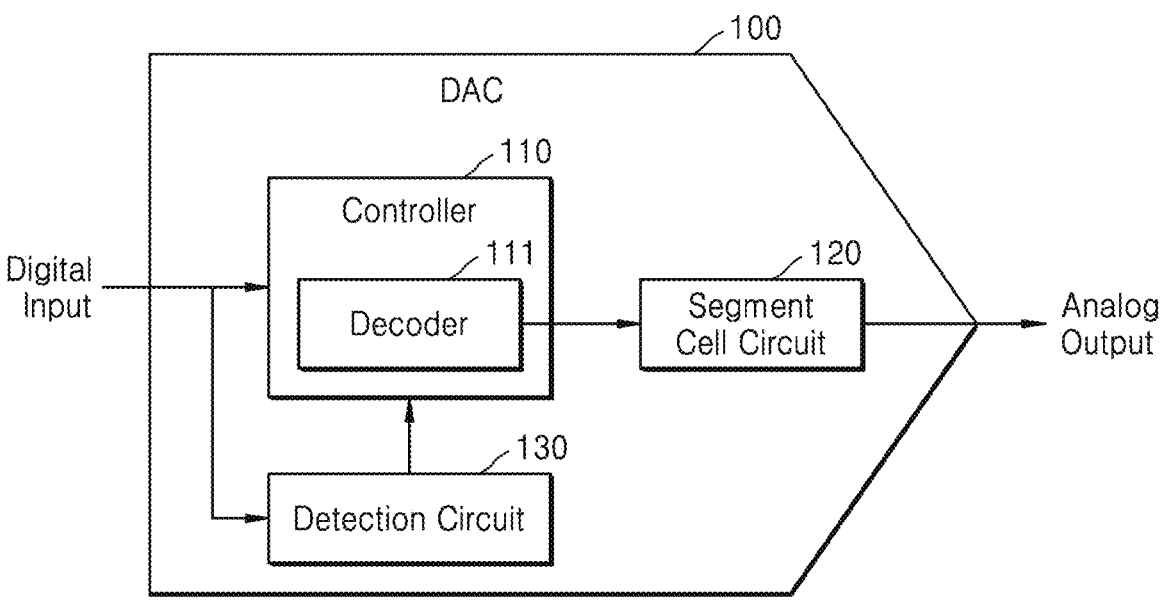
FIG. 2 is a block diagram illustrating an example of a digital-to-analog converter (DAC)

Referring to FIG. 2, the DAC 100 may include a controller 110 and a segment cell circuit 120. Also, the DAC 100 may further include a detection circuit 130.

The controller 110 may control the overall operation of the DAC 100 and process data required for the overall operation.

In some implementations, the controller 110 generates a control signal based on a digital input. The digital input may be an input including binary code. The digital input may include a preset number of bits. The bits included in the digital input may be included in any one of a plurality of bit groups.

For example, when the digital input includes 9 bits and the plurality of bit groups are 2 bit groups, a first bit group may include 3 upper bits including an uppermost bit among the bits included in the digital input and a second bit group may include the other 6 lower bits not included in the first bit group among the bits included in the digital input.

As another example, when the digital input includes 12 bits and the plurality of bit groups are 3 bit groups, a first bit group may include 3 upper bits including an uppermost bit among the bits included in the digital input, a second bit group may include middle bits including an uppermost bit of the bits not included in the first bit group among the bits included in the digital input, and a third bit group may include the other 6 lower bits not included in the bit group and the second bit group among the bits included in the digital input.

The control signal may be a signal for turning on or off a plurality of segment cells included in the segment cell circuit 120, e.g., as described below. The plurality of segment cells may be turned on or off based on the control signal.

In some implementations, the controller 110 generates a control signal based on the structure of the plurality of segment cells included in the segment cell circuit 120. When the structure of the plurality of segment cells is configured to convert an input including only binary code into an analog output, the controller 110 may turn on or off a plurality of corresponding segment cells according to the value of each of the bits included in the digital input. For example, when the value of the uppermost bit included in the digital input is a first value, the controller 110 may generate a control signal for controlling the segment cell corresponding to the uppermost bit to be turned off. As another example, when the value of the uppermost bit included in the digital input is a second value, the controller 110 may generate a control signal for controlling the segment cell corresponding to the uppermost bit to be turned on. Hereinafter, an example in which the first value is 0 and the second value is 1 will be described; however, the values are not limited thereto. For example, in some implementations, the first value is 1 and the second value is 0.

In some implementations, the controller 110 includes a decoder 111. The decoder 111 may generate a decoded input by decoding bits included in a selected bit group among the plurality of bit groups included in the digital input, e.g., by thermometer code.

For example, among the plurality of bit groups, the bit group decoded by thermometer code by the decoder 111 may be selected based on the structure of the plurality of segment cells included in the segment cell circuit 120 described below. For example, when at least a portion of the structure of the plurality of segment cells is configured to convert an input including thermometer code into an analog output, the decoder 111 may generate a decoded input by decoding digital input bits corresponding to a segment cell. The segment cell is configured to convert an input including thermometer code into an analog output using thermometer code.

As an example, when the plurality of bit groups are 2 bit groups, the decoder 111 may generate a decoded input by decoding the bits included in the first bit group by thermometer code according to the structure of the plurality of segment cells. As another example, according to the structure of the plurality of segment cells, the decoder 111 may generate a decoded input by decoding the bits included in the first bit group by thermometer code and additionally decoding the bits included in the second bit group by thermometer code. The generation of the decoded input can be performed flexibly according to various processes. For example, the decoder 111 may not decode all the bits included in 2 bit groups, e.g., depending on the structure of the plurality of segment cells.

As another example, when the plurality of bit groups are 3 bit groups, the decoder 111 may generate a decoded input by decoding the bits included in the first bit group by thermometer code according to the structure of the plurality of segment cells. As another example, according to the structure of the plurality of segment cells, the decoder 111 may generate a decoded input by decoding the bits included in the first bit group by thermometer code and additionally decoding the bits included in the second bit group by thermometer code. As another example, according to the structure of the plurality of segment cells, the decoder 111 may generate a decoded input by decoding the bits included in the first bit group by thermometer code, additionally decoding the bits included in the second bit group by thermometer code, and additionally decoding the bits included in the third bit group by thermometer code. As noted above, in some implementations, the decoder 111 may not decode all the bits included in 3 bit groups, e.g., depending on the structure of the plurality of segment cells.

In some implementations, the controller 110 generates a control signal based on the decoded input generated by the decoder 111. When the structure of the plurality of segment cells is configured to convert an input including binary code and thermometer code into an analog output, the controller 110 may turn on or off a plurality of corresponding segment cells according to the value of each of the bits included in the decoded input. When the structure of the plurality of segment cells is configured to convert an input including only thermometer code into an analog output, the controller 110 may turn on or off a plurality of corresponding segment cells according to the value of each of the bits included in the decoded input.

In some implementations, the segment cell circuit 120 includes a plurality of segment cells that are turned on or off based on the control signal generated by the controller 110. The plurality of segment cells may be formed in a structure corresponding to the plurality of bit groups included in the digital input.

For example, when the plurality of bit groups included in the digital input are 2 bit groups, the plurality of segment cells may include a plurality of first segment cells, a plurality of second segment cells, and an additional segment cell.

Each of the plurality of first segment cells may generate an output corresponding to a corresponding bit of the bits included in the first bit group of the digital input or the decoded input. In this case, when a decoded input is not generated by the decoder 111, each of the plurality of first segment cells may generate an output corresponding to each of the bits included in the first bit group of the digital input. On the other hand, when a decoded input is generated by the decoder 111, each of the plurality of first segment cells may generate an output corresponding to a corresponding bit of the bits included in the first bit group of the decoded input.

Each of the plurality of first segment cells may generate an output current according to the value of the corresponding bit included in the first bit group of the digital input or the decoded input corresponding thereto. For example, each of the plurality of first segment cells may generate an output current when the value of the corresponding bit included in the first bit group of the digital input or the decoded input corresponding thereto is the second value. In this case, the size of the output current generated by the plurality of first segment cells (e.g., the total output current) may be proportional to the size of the bit included in the first bit group of the digital input or the decoded input corresponding thereto. On the other hand, each of the plurality of first segment cells may not generate an output current when the value of the corresponding bit included in the first bit group of the digital input or the decoded input corresponding thereto is the first value.

Each of the plurality of second segment cells may generate an output corresponding to a corresponding bit of the bits included in the second bit group of the digital input or the decoded input. When a decoded input is not generated by the decoder 111, each of the plurality of second segment cells may generate an output corresponding a corresponding bit of the bits included in the second bit group of the digital input. On the other hand, when a decoded input is generated by the decoder 111, each of the plurality of second segment cells may generate an output corresponding to a corresponding bit of the bits included in the second bit group of the decoded input.

Each of the plurality of second segment cells may generate an output current according to the value of the corresponding bit included in the second bit group of the digital input or the decoded input, and a method of generating the output current may be the same as a method of generating the output current by the plurality of first segment cells, as described above.

The additional segment cell may generate an output corresponding to the lowermost bit among the bits included in the second bit group of the digital input or the decoded input.

In some implementations, when the uppermost bit of the digital input is converted from the first value to the second value and all the other bits other than the uppermost bit of the digital input are converted from the second value to the first value, the additional segment cell is turned on based on the control signal received from the controller 110. For example, when the uppermost bit of the digital input is converted from the first value to the second value and all the other bits other than the uppermost bit of the digital input are converted from the second value to the first value, the controller 110 may generate a control signal to turn on the additional segment cell. As such, because the additional segment cell is turned on when all the other bits other than the uppermost bit of the digital input are converted from the second value to the first value, all the plurality of second segment cells may be maintained in an on state without being turned off. As such, by using the additional segment cell, the DAC 100 according to some implementations may reduce an error occurring as the plurality of second segment cells are converted from an on state to an off state, thereby improving the linearity and dynamic region performance when the size of the digital input is small.

An example of operation of the additional segment cell will be described below with reference to FIGS. 3A to 4C.

As another example, when the plurality of bit groups included in the digital input are 3 bit groups, the plurality of segment cells may include a plurality of first segment cells, a plurality of second segment cells, and an additional segment cell.

In this case, the operation of the plurality of first segment cells and the plurality of second segment cells may be the same as the operation of the plurality of first segment cells and the plurality of second segment cells in the case discussed above in which the plurality of bit groups included in the digital input are 2 bit groups.

Each of the plurality of third segment cells may generate an output corresponding to a corresponding bit of the bits included in the third bit group of the digital input or the decoded input. When a decoded input is not generated by the decoder 111, each of the plurality of third segment cells may generate an output corresponding to a corresponding bit of the bits included in the third bit group of the digital input. On the other hand, when a decoded input is generated by the decoder 111, each of the plurality of third segment cells may generate an output corresponding to a corresponding bit of the bits included in the third bit group of the decoded input.

Each of the plurality of third segment cells may generate an output current according to the value of the corresponding bit included in the third bit group of the digital input or the decoded input corresponding thereto, and a method of generating the output current may be the same as the method of generating the output current by the plurality of first segment cells, as described above.

The additional segment cell may generate an output corresponding to the lowermost bit among the bits included in the second bit group of the digital input or the decoded input.

In some implementations, when the uppermost bit of the digital input is converted from the first value to the second value and all the bits included in the second bit group of the digital input are converted from the second value to the first value, the additional segment cell may be turned on based on the control signal received from the controller 110. For example, when the uppermost bit of the digital input is converted from the first value to the second value and all the bits included in the second bit group of the digital input are converted from the second value to the first value, the controller 110 may generate a control signal to turn on the additional segment cell. As such, because the additional segment cell is turned on when all the other bits other than the uppermost bit of the digital input are converted from the second value to the first value, all the plurality of second segment cells may be maintained in an on state without being turned off. As such, by using the additional segment cell, the DAC 100 according to some implementations may reduce an error occurring as the plurality of second segment cells are converted from an on state to an off state, thereby improving the linearity and dynamic region performance when the size of the digital input is small.

Another example of operation of the additional segment cell will be described below in more detail with reference to FIGS. 5A to 6C.

In some implementations, when (i) the uppermost bit of the digital input is converted from the first value to the second value, (ii) all the bits included in the second bit group of the digital input are converted from the second value to the first value, and (iii) a preset reference number or more of bits among the bits included in the third bit group of the digital input are converted from the second value to the first value, the additional segment cell may be turned on based on the control signal received from the controller 110. For example, when (i) the uppermost bit of the digital input is converted from the first value into the second value, (ii) all the bits included in the second bit group of the digital input are converted from the second value to the first value, and (iii) a preset reference number (e.g., 3) or more of bits among the bits included in the third bit group of the digital input are converted from the second value to the first value, the controller 110 may generate a control signal to turn on the additional segment cell.

The reference number may be set to a suitable number to reduce a degree of an error occurring as the plurality of segment cells are converted from an on state to an off state.

In some implementations, the segment cell circuit 120 generates an analog output based on the outputs of the plurality of segment cells. The segment cell circuit 120 may generate an analog output of a corresponding size by summing the outputs of the plurality of segment cells. For example, the segment cell circuit 120 may sum the output currents of the plurality of segment cells and generate a voltage corresponding to the summed output current as an analog output.

The detection circuit 130 may decide whether the digital input satisfies a reference condition and determine, based on a result of the decision, whether to use the additional segment cell. For example, the detection circuit 130 may receive a digital input. The detection circuit 130 may decide whether the received digital input satisfies a reference condition.

The reference condition may be set based on whether the linearity and dynamic range performance degrades significantly in the process of converting the digital input into the analog output when the additional segment cell is not used, and may be a condition based on the scale range of the digital input, the resolution of a digital input signal, and/or the like.

In some implementations, the reference condition includes a condition of whether the scale range of the digital input is less than or equal to a preset reference size. For example, the reference size may be set to –19 dBFs. In this case, when the scale range of the digital input is less than or equal to the reference size, the detection circuit 130 decides that the digital input satisfies the reference condition.

When it is decided that the digital input satisfies the reference condition, the detection circuit 130 may determine to use the additional segment cell. On the other hand, when it is decided that the digital input does not satisfy the reference condition, the detection circuit 130 may determine not to use the additional segment cell.

The controller 110 may generate a control signal based on a result of the determination of the detection circuit 130. For example, when the detection circuit 130 determines to use the additional segment cell, the controller 110 may control the segment cell circuit 120 to generate an analog output by using the additional segment cell. On the other hand, when the detection circuit 130 determines not to use the additional segment cell, the controller 110 may control the segment cell circuit 120 to generate an analog output without using the additional segment cell.

By using the detection circuit 130, the additional segment cell may be used when the performance of the DAC 100 may be improved by using the additional segment cell.

Figure 3A:
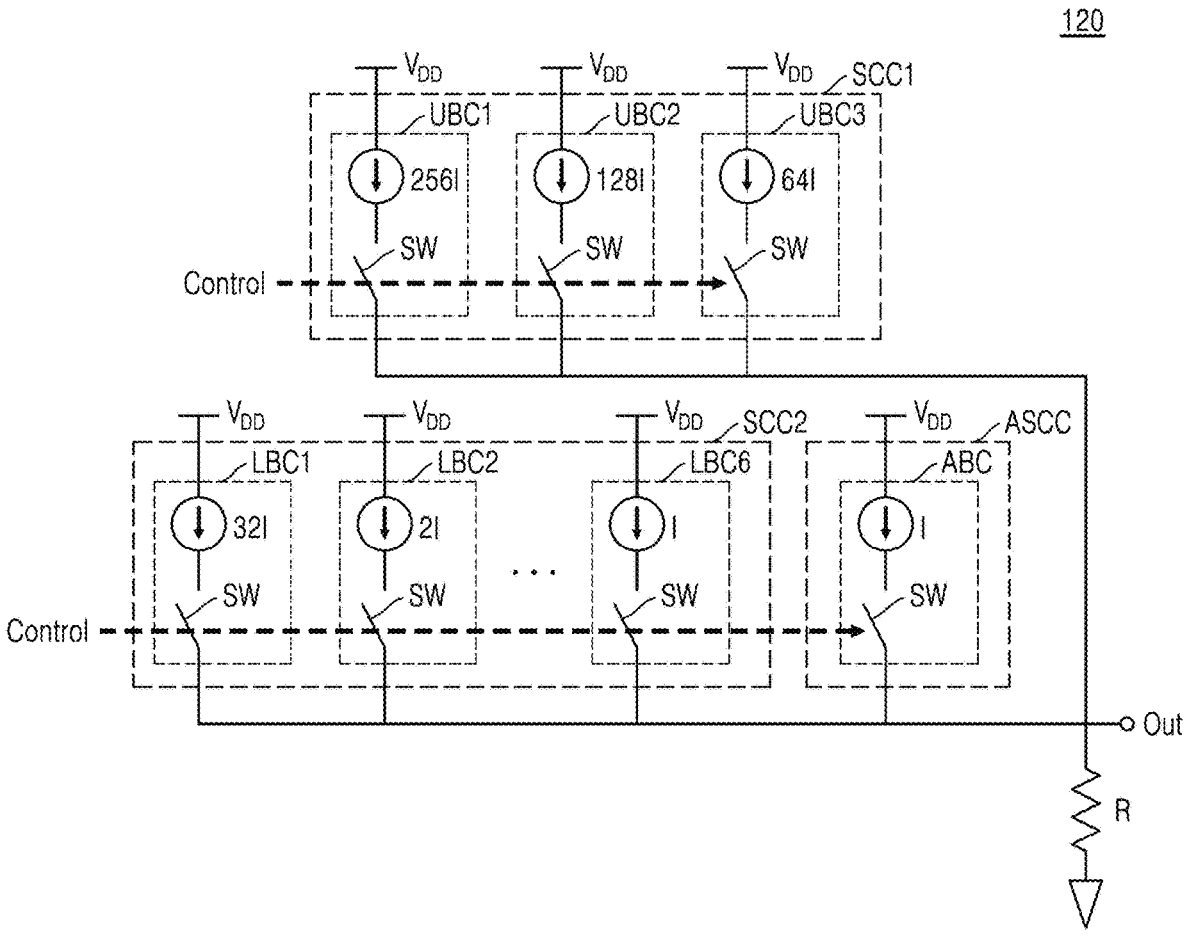
FIG. 3A is a circuit diagram illustrating an example of a segment cell circuit in which a digital input of a DAC is divided into two bit groups.
Figure 3B:
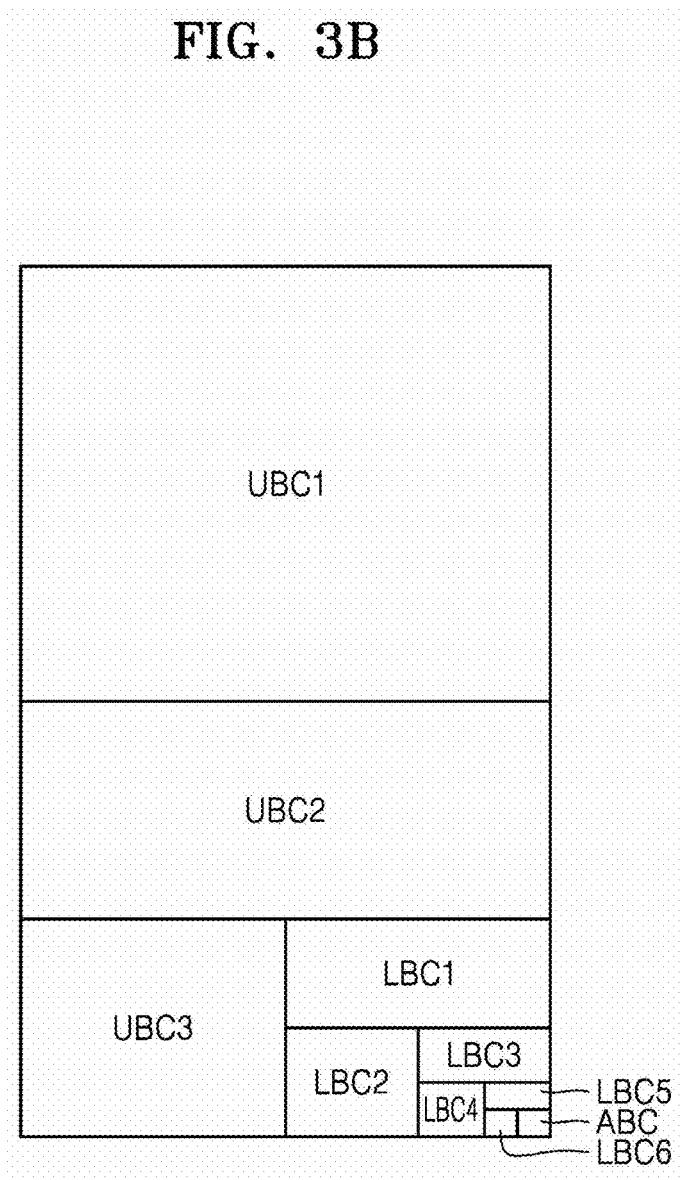
FIG. 3B is a diagram illustrating a structure of a plurality of segment cells corresponding to the segment cell circuit of FIG. 3A.

FIG. 3A is a circuit diagram illustrating a segment cell circuit when a digital input of a DAC is divided into two bit groups. FIG. 3B is a diagram illustrating a structure of a plurality of segment cells corresponding to the segment cell circuit of FIG. 3A. FIG. 3C is a table illustrating an example of the state of a plurality of segment cells corresponding to a digital input into a DAC having a segment cell circuit structure of FIG. 3A.

In the configuration illustrated in FIGS. 3A to 3C, the digital input may include 9 bits. In this case, the digital input may be divided into two bit groups, a first bit group may include 3 upper bits (located at the places $2^8$, $2^7$, and $2^6$) including the uppermost bit located at the place $2^8$ among 9 bits, and a second bit group may include the other 6 lower bits (located at the places $2^5$, $2^4$, $2^3$, $2^2$, $2^1$, and $2^0$) not included in the first bit group among the 9 bits. Also, the digital input may not be decoded by the decoder 111.

Referring to FIG. 3A, the segment cell circuit 120 includes a first segment cell circuit SCC1, a second segment cell circuit SCC2, and an additional segment cell circuit ASCC.

The first segment cell circuit SCC1 may include a plurality of first segment cells, and in the example of FIG. 3A, the plurality of first segment cells may be first to third upper bit cells UBC1 to UBC3.

The second segment cell circuit SCC2 may include a plurality of second segment cells, and in the example of FIG. 3A, the plurality of second segment cells may be first to sixth lower bit cells LBC1 to LBC6.

The additional segment cell circuit ASCC may include an additional segment cell, and in the example of FIG. 3A, the additional segment cell may be an additional bit cell ABC.

Each of the first to third upper bit cells UBC1 to UBC3, the first to sixth lower bit cells LBC1 to LBC6, and the additional bit cell ABC may include a switch SW and a current source.

Each of the switches SW included in the first to third upper bit cells UBC1 to UBC3, the first to sixth lower bit cells LBC1 to LBC6, and the additional bit cell ABC may be turned on or off by a control signal Control generated by the controller 110. For example, when the switch SW is turned on, the current source connected between the switch SW and an operation voltage terminal $V_{DD}$ may output a current to an output node Out. On the other hand, when the switch SW is turned off, the current source connected between the switch SW and the operation voltage terminal $V_{DD}$ may not output a current to the output node Out.

The current source included in the first to third upper bit cells UBC1 to UBC3 and the first to sixth lower bit cells LBC1 to LBC6 may output a current corresponding to the size of the value represented by the 9 bits included in the digital input.

In the example of FIG. 3A, the first upper bit cell UBC1 may correspond to the uppermost bit among the 9 bits included in the digital input and may output a current of 256I (where I is a reference current) corresponding to $2^8$=256, that is, the size of the uppermost bit. The second and third upper bit cells UBC2 and UBC3 may respectively correspond to the bits located at the places $2^7$ and $2^6$ of the digital input and may respectively output currents of 128I and 64I corresponding thereto.

Also, the first to sixth lower bit cells LBC1 to LBC6 may respectively correspond to the bits located at the places $2^5$ to $2^0$ of the digital input and may respectively output currents of 32I, 16I, 8I, 4I, 2I, and I corresponding thereto.

The additional bit cell ABC may generate an output corresponding to the lowermost bit among the bits included in the second bit group. Thus, in the example of FIG. 3A, the additional bit cell ABC may output a current of I corresponding to the bit located at the place $2^0$, which is the lowermost bit, among the bits included in the second bit group.

The output node Out may output a voltage corresponding to a resistance R and an output current corresponding to the sum of the currents output through the first to third upper bit cells UBC1 to UBC3, the first to sixth lower bit cells LBC1 to LBC6, and the additional bit cell ABC.

Referring to FIG. 3B, the structure of a plurality of segment cells corresponding to the segment cell circuit 120 of FIG. 3A is illustrated. The plurality of segment cells may include first to third upper bit cells UBC1 to UBC3, first to sixth lower bit cells LBC1 to LBC6, and an additional bit cell ABC. In this case, each of the first to third upper bit cells UBC1 to UBC3 and the first to sixth lower bit cells LBC1 to LBC6 have a size proportional to the size of the bit included in the digital input corresponding thereto.

In the example of FIG. 3B, the size of the first upper bit cell UBC1 may be two times the size of the second upper bit cell UBC2. The size may decrease from the second upper bit cell UBC2 toward the sixth lower bit cell LBC6, and the size may decrease by half each time it goes down by one level.

Because the additional bit cell ABC generates an output corresponding to the lowermost bit among the bits included in the second bit group, the additional bit cell ABC may have the same size as the sixth lower bit cell LBC6 corresponding to the lowermost bit among the bits included in the second bit group.

Referring to FIG. 3C, a table illustrates the state of the plurality of segment cells having the structure of the segment cell circuit 120 of FIG. 3A when a first digital input and a second digital input are consecutively input into the DAC 100. Each of the first digital input and the second digital input may include an upper bit UB and a lower bit LB.

In the table of FIG. 3C, the digital input represented in binary code is listed in the binary column of the table, the states of the first to third upper bit cells UBC1 to UBC3 are listed in the UBCs column of the table in the order of numbers, the states of the first to sixth lower bit cells LBC1 to LBC6 are listed in the LBCs column of the table in the order of numbers, and the state of the additional bit cell ABC is listed in the ABC column of the table. In this case, the state of the segment cell may be represented as 1 in the case of an on state and as 0 in the case of an off state.

First, when a first digital input DI1 represented as "011 111111" in binary code is input into the DAC 100, the controller 110 may generate a control signal based on the first digital input DI1. In this case, the first to third upper bit cells UBC1 to UBC3, the first to sixth lower bit cells LBC1 to LBC6, and the additional bit cell ABC may be turned on or off based on the control signal. In the example of FIG. 3C, the first upper bit cell UBC1 may be turned off, the second and third upper bit cells UBC2 and UBC3 and the first to sixth lower bit cells LBC1 to LBC6 may be turned on, and the additional bit cell ABC may be turned off.

After the first digital input DI1 is input, when a second digital input DI2 represented as "100 000000" in binary code is input into the DAC 100, the controller 110 may generate a control signal based on the second digital input DI2.

In this situation, when the additional bit cell ABC is not used, the first upper bit cell UBC1 should be changed from an off state to an on state and the second and third upper bit cells UBC2 and UBC3 and the first to sixth lower bit cells LBC1 to LBC6 should be changed from an on state to an off state. As such, when the states of the plurality of segment cells are changed at once, the possibility of an error occurring in the process of changing the state of the cell may increase.

Because the DAC 100 uses the additional bit cell ABC, because the uppermost bit of the digital input is converted from the first value to the second value and all the other bits other than the uppermost bit of the digital input are converted from the second value to the first value in the situation illustrated in FIG. 3C, the controller 110 may generate a control signal to turn on the additional bit cell ABC. Accordingly, the state of the first to third upper bit cells UBC1 to UBC3 and the first to sixth lower bit cells LBC1 to LBC6 may not be changed, and only the additional bit cell ABC may be changed from an off state to an on state. As such, by changing only the state of a relatively small number of segment cells, the DAC 100 may reduce the possibility of an error occurring in the process of changing the state of the cell. Thus, the linearity and dynamic range performance of the DAC 100 may be improved.

Figure 4A:
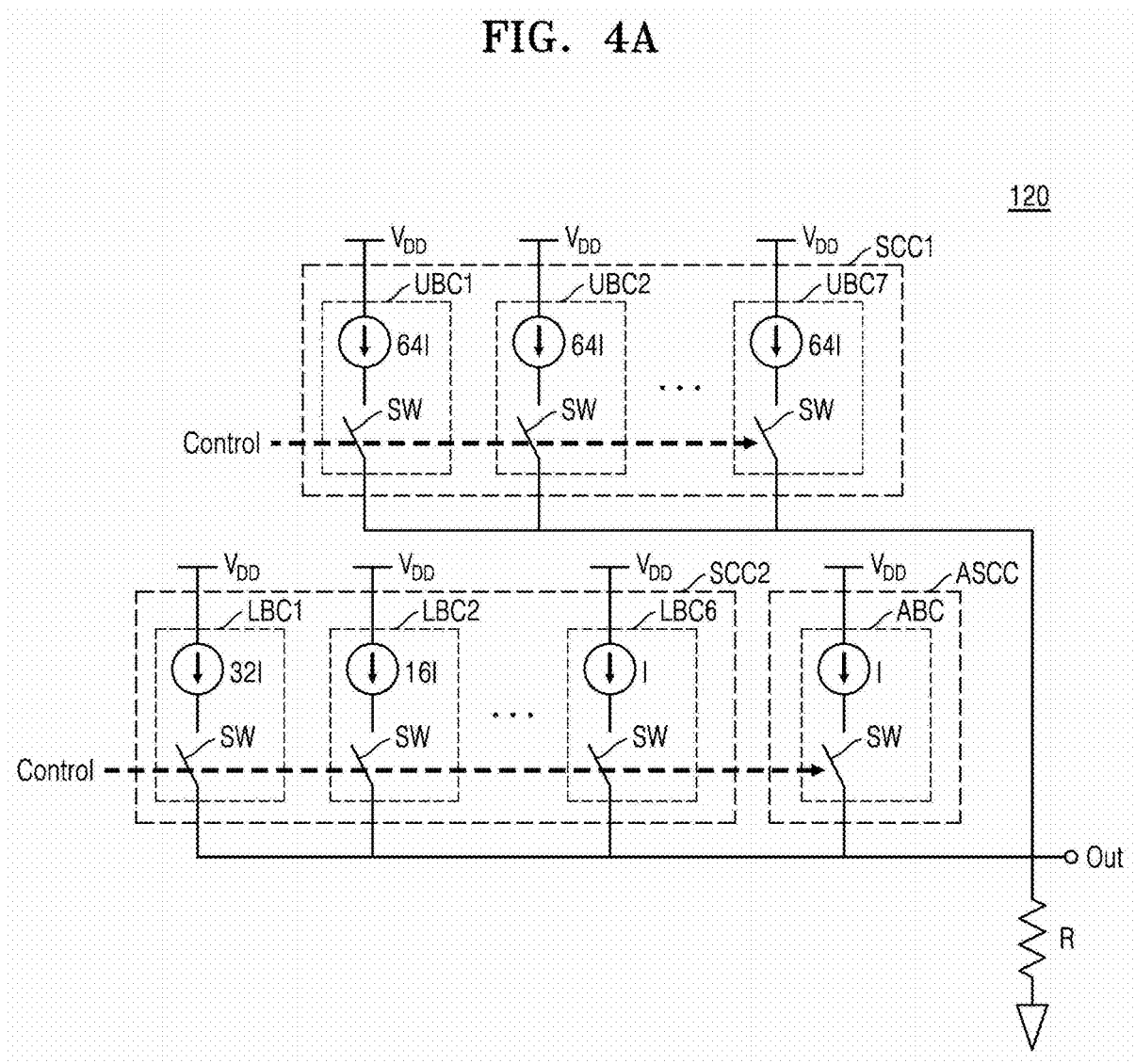
FIG. 4A is a circuit diagram illustrating an example of a segment cell circuit in which a digital input of a DAC is divided into two bit groups and upper bits are decoded by thermometer code.
Figure 4B:
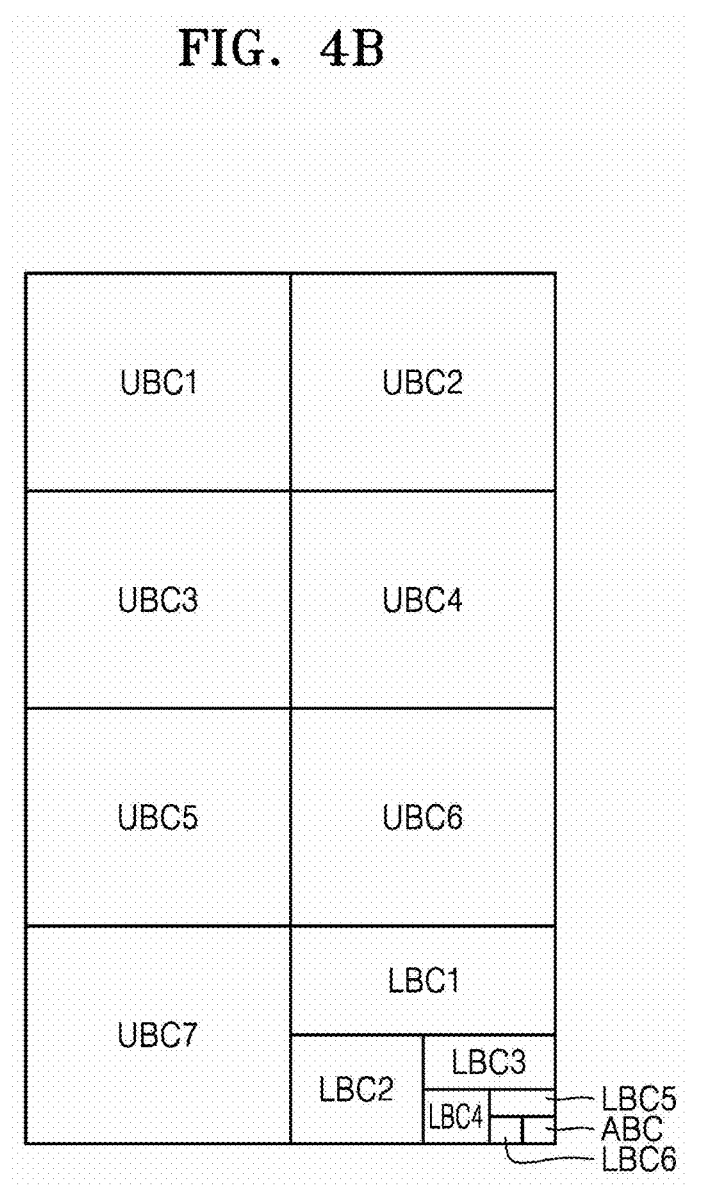

FIG. 4A is a circuit diagram illustrating a segment cell circuit in which a digital input of a DAC is divided into two bit groups and upper bits are decoded by thermometer code, according to some implementations. FIG. 4B is a diagram illustrating a structure of a plurality of segment cells corresponding to the segment cell circuit of FIG. 4A. FIG. 4C is a table illustrating an example of the state of a plurality of segment cells corresponding to a digital input into a DAC having a segment cell circuit structure of FIG. 4A.

The structure and operation of the circuit illustrated in FIGS. 4A to 4C is similar to the structure and operation of the circuit illustrated in FIGS. 3A to 3C, except for differences discussed or suggested herein. In some implementations according to FIGS. 4A to 4C, the bits included in the first bit group of the digital input may be decoded by the decoder 111. The 3 bits included in the first bit group of the digital input may be decoded into 7 bits represented in thermometer code. Accordingly, the decoder 111 may generate a decoded input including 7 upper bits represented in thermometer code and 6 lower bits represented in binary code. In this case, all of the 7 upper bits represented in thermometer code in the decoded input may have the same size, and the 6 lower bits of the decoded input may be the same as those of the digital input.

Referring to FIG. 4A, the segment cell circuit 120 includes a first segment cell circuit SCC1, a second segment cell circuit SCC2, and an additional segment cell circuit ASCC.

The first segment cell circuit SCC1 may include a plurality of first segment cells, and in the example of FIG. 4A, the plurality of first segment cells may be first to seventh upper bit cells UBC1 to UBC7.

The second segment cell circuit SCC2 may include a plurality of second segment cells, and in the example of FIG. 4A, the plurality of second segment cells may be first to sixth lower bit cells LBC1 to LBC6.

The additional segment cell circuit ASCC may include an additional segment cell, and in the example of FIG. 4A, the additional segment cell may be an additional bit cell ABC.

Each of the first to seventh upper bit cells UBC1 to UBC7, the first to sixth lower bit cells LBC1 to LBC6, and the additional bit cell ABC may include a switch SW and a current source, and the change of the state of the switch SW according to a control signal Control and whether the current source outputs a current to an output node Out may be the same as those described above with reference to FIG. 3A.

The current source included in the first to seventh upper bit cells UBC1 to UBC7 and the first to sixth lower bit cells LBC1 to LBC6 may output a current corresponding to the size of the value represented by the 13 bits included in the decoded input.

In the example of FIG. 4A, the first to seventh upper bit cells UBC1 to UBC7 may respectively correspond to 7 upper bits among the 13 bits included in the decoded input and may output a current of 64I corresponding to $2^6=64$ that is the size of the 7 upper bits.

Also, the first to sixth lower bit cells LBC1 to LBC6 may respectively correspond to the bits located at the places $2^5$ to $2^0$ of the decoded input and may respectively output currents of 32I, 16I, 8I, 4I, 2I, and I corresponding thereto.

The additional bit cell ABC may generate an output corresponding to the lowermost bit among the bits included in the second bit group. For example, in the case of FIG. 4A, the additional bit cell ABC may output a current of I corresponding to the bit located at the place $2^1$, which is the lowermost bit, among the bits included in the second bit group.

The output node Out may output a voltage corresponding to a resistance R and an output current corresponding to the sum of the currents output through the first to seventh upper bit cells UBC1 to UBC7, the first to sixth lower bit cells LBC1 to LBC6, and the additional bit cell ABC.

Referring to FIG. 4B, the structure of a plurality of segment cells corresponding to the segment cell circuit 120 of FIG. 4A is illustrated. The plurality of segment cells may include first to seventh upper bit cells UBC1 to UBC7, first to sixth lower bit cells LBC1 to LBC6, and an additional bit cell ABC. In this case, each of the first to seventh upper bit cells UBC1 to UBC7 and the first to sixth lower bit cells LBC1 to LBC6 may have a size proportional to the size of the bit included in the decoded input corresponding thereto.

In the example of FIG. 4B, all of the first to seventh upper bit cells UBC1 to UBC7 have the same size. The size of the seventh upper bit cell UBC7 may be two times the size of the first lower bit cell LBC1. The size may decrease from the first lower bit cell LBC1 toward the sixth lower bit cell LBC6, and the size may decrease by half each time it goes down by one level.

Because the additional bit cell ABC generates an output corresponding to the lowermost bit among the bits included in the second bit group, the additional bit cell ABC may have the same size as the sixth lower bit cell LBC6 corresponding to the lowermost bit among the bits included in the second bit group.

Referring to FIG. 4C, a table illustrates the state of the plurality of segment cells having the structure of the segment cell circuit 120 of FIG. 4A when a first digital input and a second digital input are consecutively input into the DAC 100. Each of the first digital input and the second digital input may include an upper bit UB and a lower bit LB.

In the table of FIG. 4C, the decoded input represented in thermometer code and binary code is listed in the (thermometer+binary) column of the table, the states of the first to seventh upper bit cells UBC1 to UBC7 are listed in the UBCs column of the table in the order of numbers, the states of the first to sixth lower bit cells LBC1 to LBC6 are listed in the LBCs column of the table in the order of numbers, and the state of the additional bit cell ABC is listed in the ABC column of the table. In this case, the state of the segment cell may be represented as 1 in the case of an on state and as 0 in the case of an off state.

First, when a first digital input DI1 represented as "011 111111" in binary code is input into the DAC 100, the controller 110 may decode the first digital input DI1 to generate a first decoded input represented as "000111 111111" in thermometer code and binary code.

The controller 110 may generate a control signal based on the first decoded input. In this case, the first to seventh upper bit cells UBC1 to UBC7, the first to sixth lower bit cells LBC1 to LBC6, and the additional bit cell ABC may be turned on or off based on the control signal. In the example of FIG. 4C, the first to fourth upper bit cells UBC1 to UBC4 may be turned off, the fifth to seventh upper bit cells UBC5 to UBC7 and the first to sixth lower bit cells LBC1 to LBC6 may be turned on, and the additional bit cell ABC may be turned off.

After the first digital input DI1 is input, when a second digital input DI2 represented as "100 000000" in binary code is input into the DAC 100, the decoder 111 may decode the second digital input DI2 to generate a second decoded input represented as "0001111 000000" in thermometer code and binary code.

The controller 110 may generate a control signal based on the second decoded input.

In this situation, when the additional bit cell ABC is not used, the first to sixth lower bit cells LBC1 to LBC6 should be changed from an on state to an off state. As such, when the states of the plurality of segment cells are changed at once, the possibility of an error occurring in the process of changing the state of the cell may increase.

Because the DAC 100 uses the additional bit cell ABC, because the uppermost bit of the digital input is converted from the first value to the second value and all the other bits other than the uppermost bit of the digital input are converted from the second value to the first value in the situation illustrated in FIG. 4C, the controller 110 may generate a control signal to turn on the additional bit cell ABC. Accordingly, the state of the first to seventh upper bit cells UBC1 to UBC7 and the first to sixth lower bit cells LBC1 to LBC6 may not be changed, and only the additional bit cell ABC may be changed from an off state to an on state. As such, by changing only the state of a relatively small number of segment cells, the DAC 100 may reduce the possibility of an error occurring in the process of changing the state of the cell. Thus, the linearity and dynamic range performance of the DAC 100 may be improved.

Figure 5A:
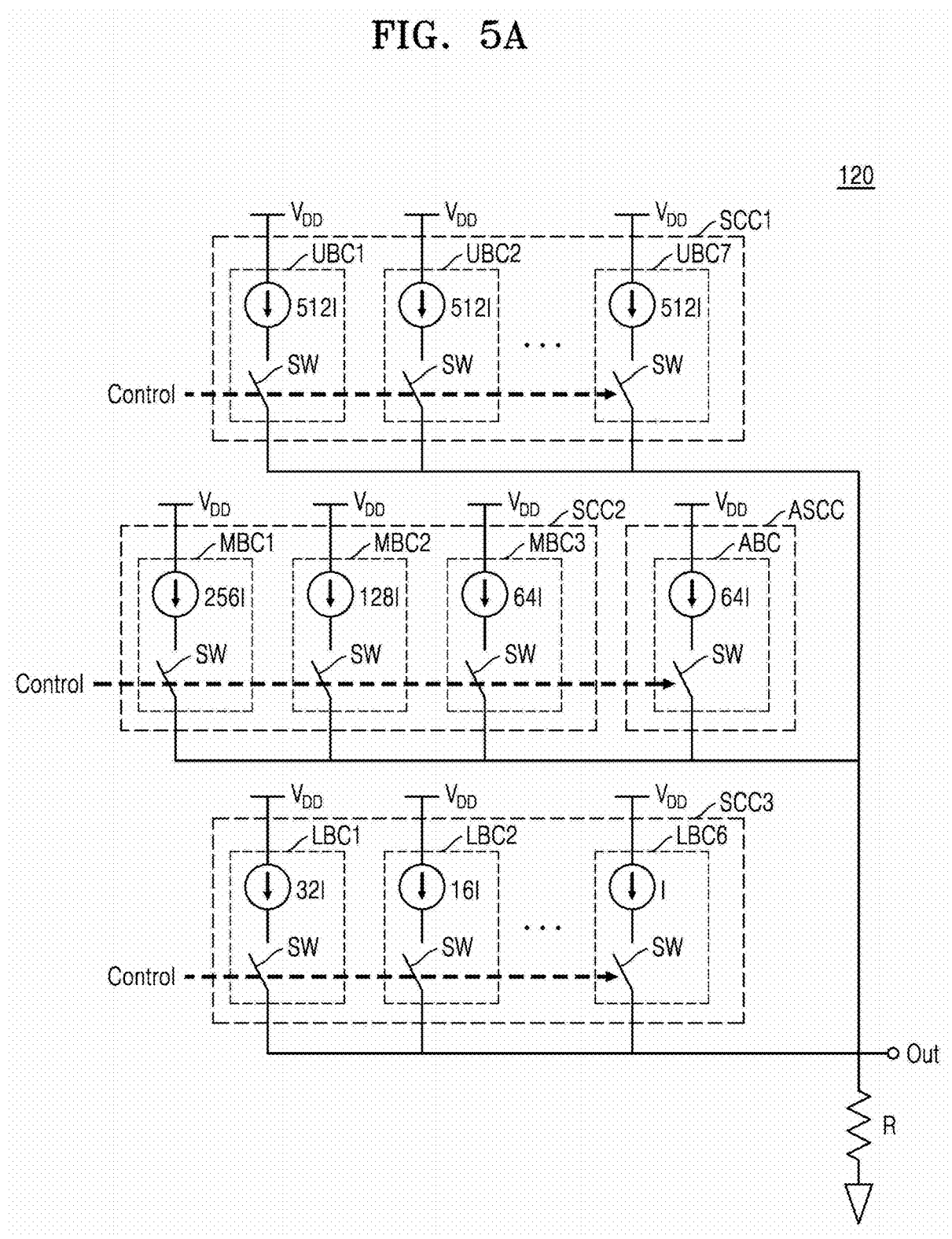
FIG. 5A is a circuit diagram illustrating an example of a segment cell circuit in which a digital input of a DAC is divided into three bit groups and upper bits are decoded by thermometer code.
Figure 5B:
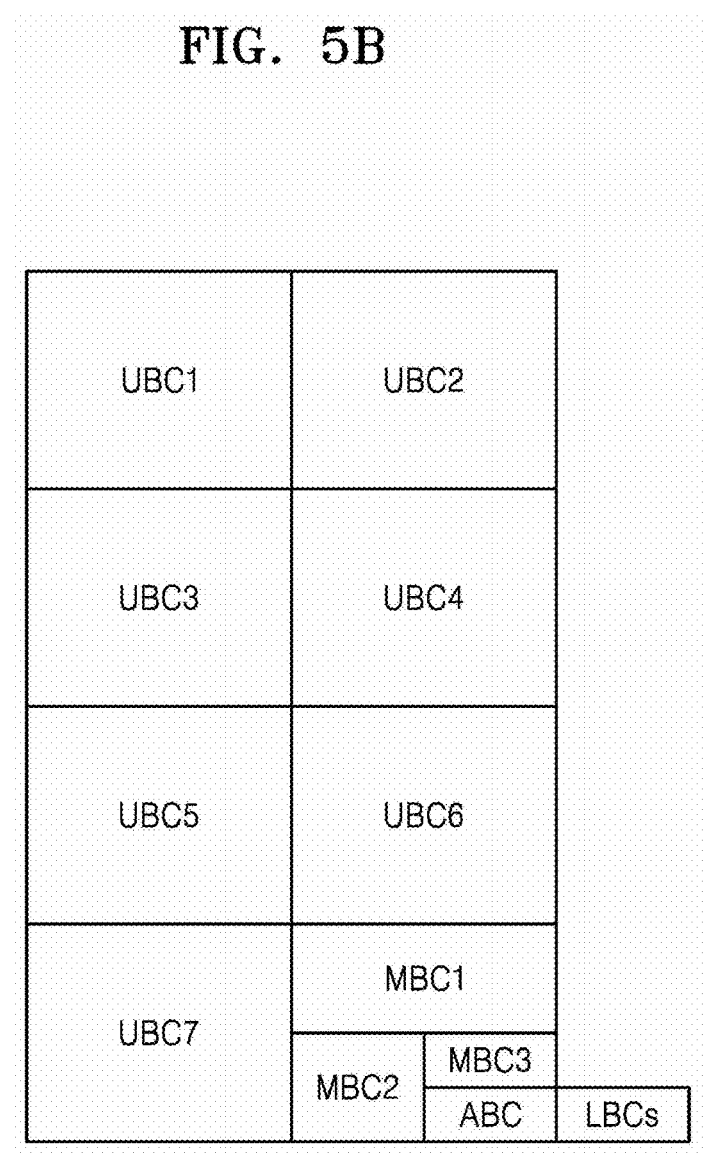

FIG. 5A is a circuit diagram illustrating a segment cell circuit in which a digital input of a DAC is divided into three bit groups and upper bits are decoded by thermometer code, according to some implementations. FIG. 5B is a diagram illustrating a structure of a plurality of segment cells corresponding to the segment cell circuit of FIG. 5A. FIG. 5C is a table illustrating an example of the state of a plurality of segment cells corresponding to a digital input into a DAC having the segment cell circuit structure of FIG. 5A.

In the example illustrated in FIGS. 5A to 5C, the digital input includes 12 bits. In this case, the digital input may be divided into three bit groups. A first bit group may include 3 upper bits (located at the places $2^{11}$, $2^{10}$, and $2^9$) including the uppermost bit located at the place $2^{11}$ among the 12 bits. A second bit group may include 3 middle bits (located at the places $2^8$, $2^7$, and $2^6$) including the bit located at the place $2^8$, which is the uppermost bit of the bits not included in the first bit group. A third bit group may include the other 6 lower bits (located at the places $2^5$, $2^4$, $2^3$, $2^2$, $2^1$, and $2^0$) not included in the first bit group and the second bit group among the 12 bits. Also, the bits included in the first bit group of the digital input may be decoded by the decoder 111. In some implementations, as shown in FIGS. 5A to 5C, the 3 bits included in the first bit group of the digital input may be decoded into 7 bits represented in thermometer code. Accordingly, the decoder 111 may generate a decoded input including 7 upper bits represented in thermometer code and 3 middle bits and 6 lower bits represented in binary code. In this case, all of the 7 upper bits represented in thermometer code in the decoded input may have the same size, and the 3 middle bits and the 6 lower bits of the decoded input may be the same as those of the digital input.

Referring to FIG. 5A, the segment cell circuit 120 includes a first segment cell circuit SCC1, a second segment cell circuit SCC2, a third segment cell circuit SCC3, and an additional segment cell circuit ASCC.

The first segment cell circuit SCC1 may include a plurality of first segment cells, and, in the example of FIG. 5A, the plurality of first segment cells may be first to seventh upper bit cells UBC1 to UBC7.

The second segment cell circuit SCC2 may include a plurality of second segment cells, and in the example of FIG. 5A, the plurality of second segment cells may be first to third middle bit cells MBC1 to MBC3.

The third segment cell circuit SCC3 may include a plurality of third segment cells, and, in the example of FIG. 5A, the plurality of third segment cells may be first to sixth lower bit cells LBC1 to LBC6.

The additional segment cell circuit ASCC may include an additional segment cell, and, in the example of FIG. 5A, the additional segment cell may be an additional bit cell ABC.

Each of the first to seventh upper bit cells UBC1 to UBC7, the first to third middle bit cells MBC1 to MBC3, the first to sixth lower bit cells LBC1 to LBC6, and the additional bit cell ABC may include a switch SW and a current source, and the change of the state of the switch SW according to a control signal Control and whether the current source outputs a current to an output node Out may be the same as those described above with reference to FIG. 3A.

The current source included in the first to seventh upper bit cells UBC1 to UBC7, the first to third middle bit cells MBC1 to MBC3, and the first to sixth lower bit cells LBC1 to LBC6 may output a current corresponding to the size of the value represented by the 16 bits included in the decoded input.

In the example of FIG. 5A, the first to seventh upper bit cells UBC1 to UBC7 may respectively correspond to 7 upper bits among the 16 bits included in the decoded input and may output a current of 512I corresponding to $2^9=512$ that is the size of the 7 upper bits.

Also, the first to third middle bit cells MBC1 to MBC3 may respectively correspond to the bits located at the places $2^8$ to $2^6$ of the decoded input and may respectively output currents of 256I, 128I, and 64I corresponding thereto.

Also, the first to sixth lower bit cells LBC1 to LBC6 may respectively correspond to the bits located at the places $2^5$ to $2^0$ of the decoded input and may respectively output currents of 32I, 16I, 8I, 4I, 2I, and I corresponding thereto.

The additional bit cell ABC may generate an output corresponding to the lowermost bit among the bits included in the second bit group. For example, in the case of FIG. 5A, the additional bit cell ABC may output a current of 64I corresponding to the bit located at the place $2^6$, which is the lowermost bit among the bits included in the second bit group.

The output node Out may output a voltage corresponding to a resistance R and an output current corresponding to the sum of the currents output through the first to seventh upper bit cells UBC1 to UBC7, the first to third middle bit cells MBC1 to MBC3, the first to sixth lower bit cells LBC1 to LBC6, and the additional bit cell ABC.

Referring to FIG. 5B, the structure of a plurality of segment cells corresponding to the segment cell circuit 120 of FIG. 5A is illustrated. The plurality of segment cells include first to seventh upper bit cells UBC1 to UBC7, first to third middle bit cells MBC1 to MBC3, first to sixth lower bit cells LBC1 to LBC6, and an additional bit cell ABC. In this case, each of the first to seventh upper bit cells UBC1 to UBC7 and the first to third middle bit cells MBC1 to MBC3 has a size proportional to the size of the bit included in the decoded input corresponding thereto. It is illustrated that the total size of the first to sixth lower bit cells LBCs is equal to that of the third middle bit cell MBC3; however, in some implementations, the total size may be smaller than the size of the third middle bit cell MBC3.

In the example of FIG. 5B, all of the first to seventh upper bit cells UBC1 to UBC7 have the same size. The size of the seventh upper bit cell UBC7 is two times the size of the first middle bit cell MBC1. The size may decrease from the first middle bit cell MBC1 toward the third middle bit cell MBC3, and the size may decrease by half each time it goes down by one level.

Because the additional bit cell ABC generates an output corresponding to the lowermost bit among the bits included in the second bit group, the additional bit cell ABC may have the same size as the third middle bit cell MBC3 corresponding to the lowermost bit among the bits included in the second bit group.

Referring to FIG. 5C, a table illustrates the state of the plurality of segment cells having the structure of the segment cell circuit 120 of FIG. 5A when a first digital input and a second digital input are consecutively input into the DAC 100. Each of the first digital input and the second digital input may include an upper bit UB, a middle bit MB, and a lower bit LB.

In the table of FIG. 5C, the decoded input represented in thermometer code and binary code is listed in the (thermometer+binary) column of the table, the states of the first to seventh upper bit cells UBC1 to UBC7 are listed in the UBCs column of the table in the order of numbers, the states of the first to third middle bit cells MBC1 to MBC3 are listed in the MBCs column of the table in the order of numbers, the states of the first to sixth lower bit cells LBC1 to LBC6 are listed in the LBCs column of the table in the order of numbers, and the state of the additional bit cell ABC is listed in the ABC column of the table. In this case, the state of the segment cell may be represented as 1 in the case of an on state and as 0 in the case of an off state.

First, when a first digital input DI1 represented as "011 111 111111" in binary code is input into the DAC 100, the controller 110 may decode the first digital input DI1 to generate a first decoded input represented as "000111 111 111111" in thermometer code and binary code.

The controller 110 may generate a control signal based on the first decoded input. In this case, the first to seventh upper bit cells UBC1 to UBC7, the first to third middle bit cells MBC1 to MBC3, the first to sixth lower bit cells LBC1 to LBC6, and the additional bit cell ABC may be turned on or off based on the control signal. In the example of FIG. 5C, the first to fourth upper bit cells UBC1 to UBC4 may be turned off, the fifth to seventh upper bit cells UBC5 to UBC7, the first to third middle bit cells MBC1 to MBC3, and the first to sixth lower bit cells LBC1 to LBC6 may be turned on, and the additional bit cell ABC may be turned off.

After the first digital input DI1 is input, when a second digital input DI2 represented as "100 000 000000" in binary code is input into the DAC 100, the decoder 111 may decode the second digital input DI2 to generate a second decoded input represented as "0001111 000 000000" in thermometer code and binary code.

The controller 110 may generate a control signal based on the second decoded input.

In this situation, when the additional bit cell ABC is not used, the first to third middle bit cells MBC1 to MBC3 and the first to sixth lower bit cells LBC1 to LBC6 should be changed from an on state to an off state. As such, when the states of the plurality of segment cells are changed at once, the possibility of an error occurring in the process of changing the state of the cell may increase.

Because the DAC 100 uses the additional bit cell ABC, because the uppermost bit of the digital input is converted from the first value to the second value and all the bits included in the second bit group of the digital input are converted from the second value to the first value in the situation illustrated in FIG. 5C, the controller 110 may generate a control signal to turn on the additional bit cell ABC. Accordingly, the state of the first to seventh upper bit cells UBC1 to UBC7 and the first to third middle bit cells MBC1 to MBC3 may not be changed, the first to sixth lower bit cells LBC1 to LBC6 may be changed from an on state to an off state, and the additional bit cell ABC may be changed from an off state to an on state. As such, by changing only the state of a relatively small number of segment cells, the DAC 100 may reduce the possibility of an error occurring in the process of changing the state of the cell. Thus, the linearity and dynamic range performance of the DAC 100 may be improved.

Figure 6A:
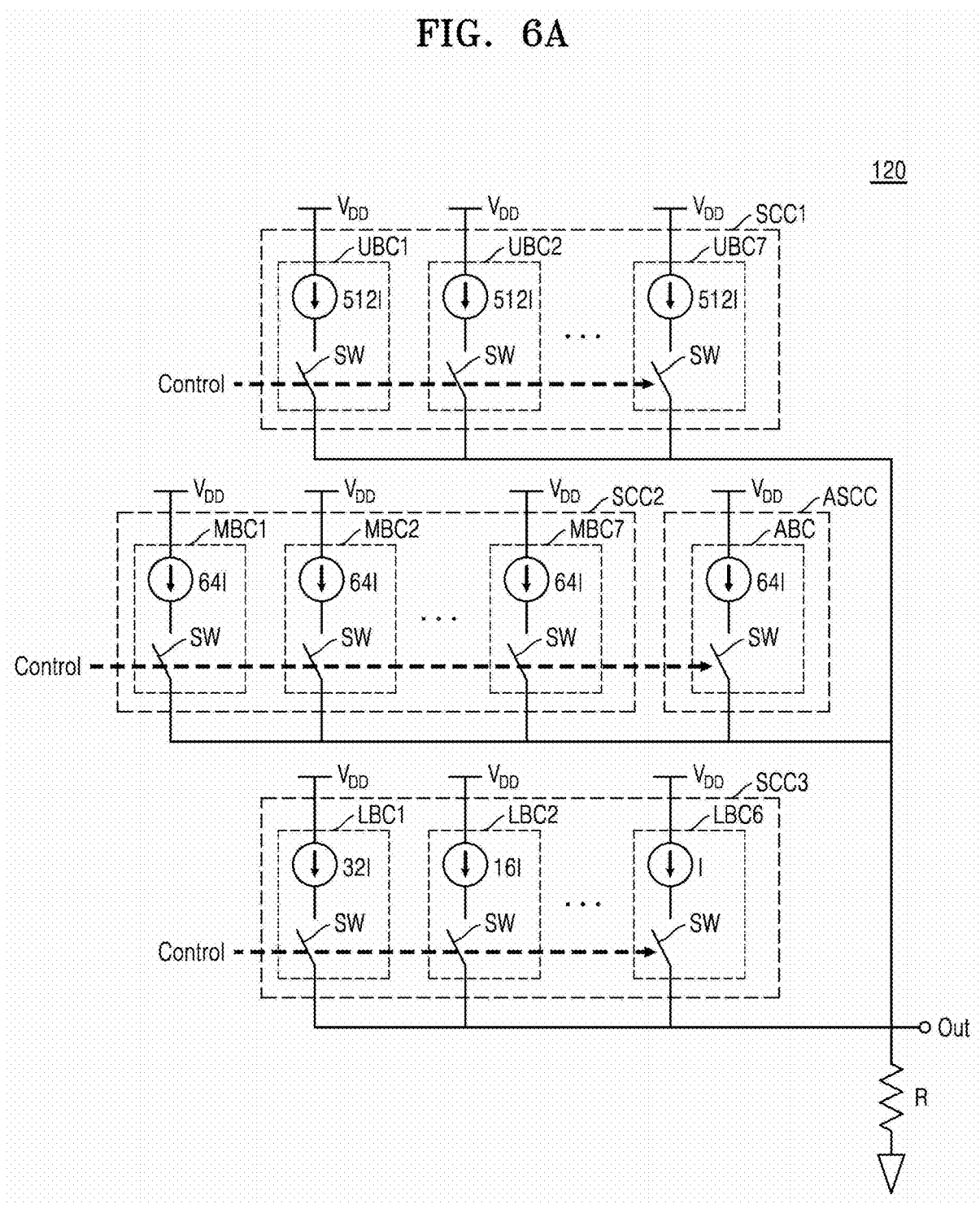
FIG. 6A is a circuit diagram illustrating an example of a segment cell circuit in which a digital input of a DAC is divided into three bit groups and upper bits and middle bits are decoded by thermometer code.

FIG. 6A is a circuit diagram illustrating a segment cell circuit in which a digital input of a DAC is divided into three bit groups and each of upper bits and middle bits is decoded by thermometer code, according to some implementations. FIG. 6B is a diagram illustrating a structure of a plurality of segment cells corresponding to the segment cell circuit of FIG. 6A. FIG. 6C is a table illustrating an example of the state of a plurality of segment cells corresponding to a digital input into a DAC having the segment cell circuit structure of FIG. 6A.

The example illustrated in FIGS. 6A to 6C can have structure and operation similar to that described with respect to FIGS. 5A to 5C, except where noted or suggested otherwise. In this example, the bits included in the first bit group of the digital input may be decoded by the decoder 111, and the 3 bits included in the second bit group of the digital input may be decoded into 7 bits represented in thermometer code. Accordingly, the decoder 111 may generate a decoded input including 7 upper bits and 7 middle bits represented in thermometer code and 6 lower bits represented in binary code. In this case, all of the 7 upper bits represented in thermometer code in the decoded input may have the same size, all of the 7 middle bits represented in thermometer code may have the same size, and the 6 lower bits of the decoded input may be the same as those of the digital input.

Referring to FIG. 6A, the segment cell circuit 120 includes a first segment cell circuit SCC1, a second segment cell circuit SCC2, a third segment cell circuit SCC3, and an additional segment cell circuit ASCC.

The first segment cell circuit SCC1 may include a plurality of first segment cells, and. in the example of FIG. 6A, the plurality of first segment cells may be first to seventh upper bit cells UBC1 to UBC7.

The second segment cell circuit SCC2 may include a plurality of second segment cells, and. in the example of FIG. 6A, the plurality of second segment cells may be first to seventh middle bit cells MBC1 to MBC7.

The third segment cell circuit SCC3 may include a plurality of third segment cells, and in the example of FIG. 6A, the plurality of third segment cells may be first to sixth lower bit cells LBC1 to LBC6.

The additional segment cell circuit ASCC may include an additional segment cell, and in the example of FIG. 6A, the additional segment cell may be an additional bit cell ABC.

Each of the first to seventh upper bit cells UBC1 to UBC7, the first to seventh middle bit cells MBC1 to MBC7, the first to sixth lower bit cells LBC1 to LBC6, and the additional bit cell ABC may include a switch SW and a current source, and the change of the state of the switch SW according to a control signal Control and whether the current source outputs a current to an output node Out may be the same as those described above with reference to FIG. 3A.

The current source included in the first to seventh upper bit cells UBC1 to UBC7, the first to seventh middle bit cells MBC1 to MBC7, and the first to sixth lower bit cells LBC1 to LBC6 may output a current corresponding to the size of the value represented by the 20 bits included in the decoded input.

In the example of FIG. 6A, the first to seventh upper bit cells UBC1 to UBC7 may respectively correspond to 7 upper bits among the 20 bits included in the decoded input and may output a current of 512I corresponding to $2^9=512$ that is the size of the 7 upper bits.

Also, the first to seventh middle bit cells MBC1 to MBC7 may respectively correspond to 7 middle bits among the 20 bits included in the decoded input and may output a current of 64I corresponding to $2^6=64$ that is the size of the 7 middle bits.

Also, the first to sixth lower bit cells LBC1 to LBC6 may respectively correspond to the bits located at the places $2^5$ to $2^0$ of the decoded input and may respectively output currents of 32I, 16I, 8I, 4I, 2I, and I corresponding thereto.

The additional bit cell ABC may generate an output corresponding to the lowermost bit among the bits included in the second bit group. In the example of FIG. 6A, the additional bit cell ABC may output a current of 64I corresponding to the bit located at the place $2^6$, which is the lowermost bit among the bits included in the second bit group.

The output node Out may output a voltage corresponding to a resistance R and an output current corresponding to the sum of the currents output through the first to seventh upper bit cells UBC1 to UBC7, the first to seventh middle bit cells MBC1 to MBC7, the first to sixth lower bit cells LBC1 to LBC6, and the additional bit cell ABC.

Referring to FIG. 6B, the structure of a plurality of segment cells corresponding to the segment cell circuit 120 of FIG. 6A is illustrated. The plurality of segment cells may include first to seventh upper bit cells UBC1 to UBC7, first to seventh middle bit cells MBC1 to MBC7, first to sixth lower bit cells LBC1 to LBC6, and an additional bit cell ABC. In this case, each of the first to seventh upper bit cells UBC1 to UBC7 and the first to seventh middle bit cells MBC1 to MBC7 may have a size proportional to the size of the bit included in the decoded input corresponding thereto. In this case, it is illustrated that the total size of the first to sixth lower bit cells LBCs is equal to the size of each of the first to seventh middle bit cells MBC1 to MBC7; however, in some implementations, the size is smaller than the size of each of the first to seventh middle bit cells MBC1 to MBC7.

In the example of FIG. 6B, all of the first to seventh upper bit cells UBC1 to UBC7 have the same size. The size of the seventh upper bit cell UBC7 is 8 times the size of the first middle bit cell MBC1. Also, all of the first to seventh middle bit cells MBC1 to MBC7 have the same size.

Because the additional bit cell ABC generates an output corresponding to the lowermost bit among the bits included in the second bit group, the additional bit cell ABC may have the same size as the seventh middle bit cell MBC7 corresponding to the lowermost bit among the bits included in the second bit group.

Referring to FIG. 6C, a table illustrates the state of the plurality of segment cells having the structure of the segment cell circuit 120 of FIG. 6A when a first digital input and a second digital input are consecutively input into the DAC 100. Each of the first digital input and the second digital input may include an upper bit UB, a middle bit MB, and a lower bit LB.

In the table of FIG. 6C, the decoded input represented in thermometer code and binary code is listed in the (thermometer+binary) column of the table, the states of the first to seventh upper bit cells UBC1 to UBC7 are listed in the UBCs column of the table in the order of numbers, the states of the first to seventh middle bit cells MBC1 to MBC7 are listed in the MBCs column of the table in the order of numbers, the states of the first to sixth lower bit cells LBC1 to LBC6 are listed in the LBCs column of the table in the order of numbers, and the state of the additional bit cell ABC is listed in the ABC column of the table. In this case, the state of the segment cell may be represented as 1 in the case of an
on state and as 0 in the case of an off state.

First, when a first digital input DI1 represented as "011
111 111111" in binary code is input into the DAC 100, the
controller 110 may decode the first digital input DI1 to
generate a first decoded input represented as "0000111
1111111 111111" in thermometer code and binary code.

The controller 110 may generate a control signal based on
the first decoded input. In this case, the first to seventh upper
bit cells UBC1 to UBC7, the first to seventh middle bit cells
MBC1 to MBC7, the first to sixth lower bit cells LBC1 to
LBC6, and the additional bit cell ABC may be turned on or
off based on the control signal. In the example of FIG. 6C,
the first to fourth upper bit cells UBC1 to UBC4 may be
turned off, the fifth to seventh upper bit cells UBC5 to
UBC7, the first to seventh middle bit cells MBC1 to MBC7,
and the first to sixth lower bit cells LBC1 to LBC6 may be
turned on, and the additional bit cell ABC may be turned off.

After the first digital input DI1 is input, when a second
digital input DI2 represented as "100 000 000001" in binary
code is input into the DAC 100, the decoder 111 may decode
the second digital input DI2 to generate a second decoded
input represented as "0001111 0000000 000001" in ther-
mometer code and binary code.

The controller 110 may generate a control signal based on
the second decoded input.

In this case, when the additional bit cell ABC is not used,
the first to sixth middle bit cells MBC1 to MBC6 and the
first to fifth lower bit cells LBC1 to LBC5 are changed from
an on state to an off state. As such, when the states of the
plurality of segment cells are changed at once, the possibility
of an error occurring in the process of changing the state of
the cell may increase.

Because the DAC 100 uses the additional bit cell ABC,
because the uppermost bit of the digital input is converted
from the first value into the second value, all the bits
included in the second bit group of the digital input are
converted from the second value to the first value, and a
preset reference number (e.g., 3) or more of bits among the
bits included in the third bit group of the digital input are
converted from the second value to the first value, in the
situation illustrated in FIG. 6C, the controller 110 may
generate a control signal to turn on the additional bit cell.
Accordingly, the state of the first to seventh upper bit cells
UBC1 to UBC7, the first to sixth middle bit cells MBC1 to
MBC6, and the sixth lower bit cell LBC6 may not be
changed, the first to fifth lower bit cells LBC1 to LBC5 may
be changed from an on state to an off state, and the additional
bit cell ABC may be changed from an off state to an on state.
As such, by changing only the state of a relatively small
number of segment cells, the DAC 100 may reduce the
possibility of an error occurring in the process of changing
the state of the cell. Thus, the linearity and dynamic range
performance of the DAC 100 may be improved.

Figure 7:
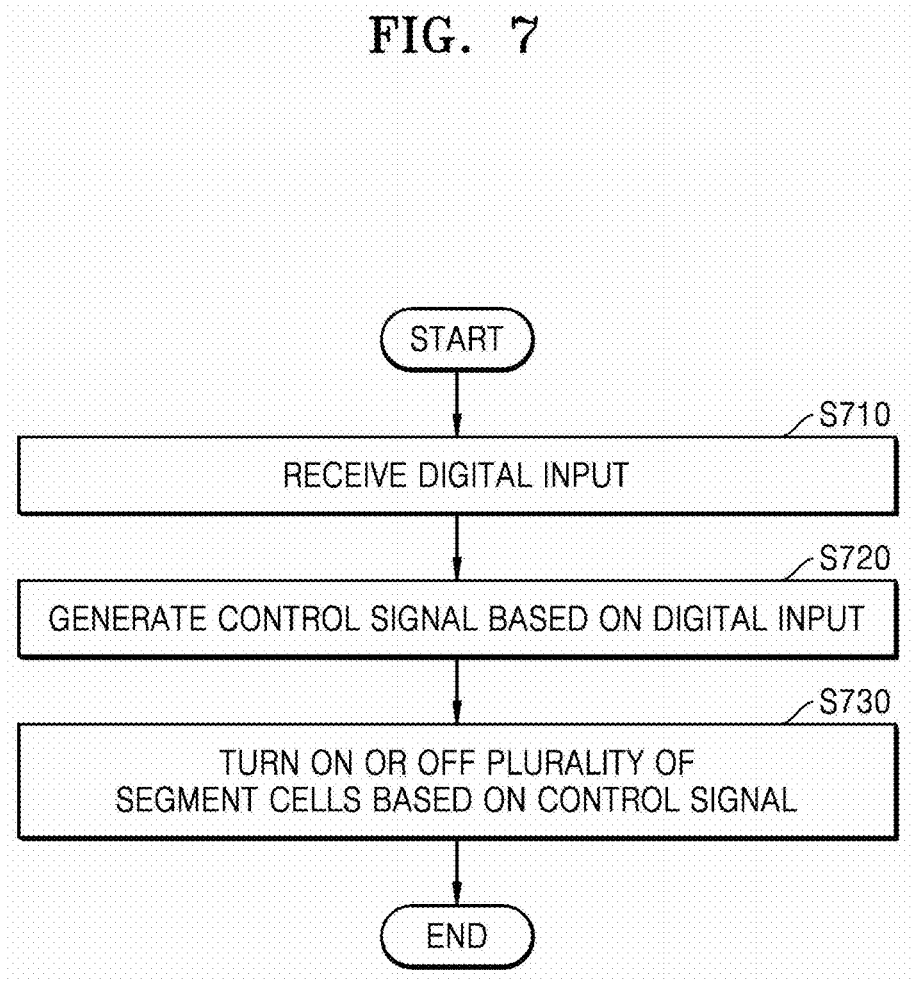
FIG. 7 is a flowchart illustrating an example of an operating method of a DAC.

FIG. 7 is a flowchart illustrating an operating method of
a DAC according to some implementations of the present
disclosure, e.g., the DAC 100 having a structure as described
with respect to FIGS. 1 to 6C.

Referring to FIG. 7, in operation S710, the DAC 100 may
receive a digital input. The DAC 100 may receive the digital
input from another device such as the processor 10 in
communication device 1.

In operation S720, the DAC 100 may generate a control
signal based on the digital input.

For example, according to the configuration of the seg-
ment cell circuit 120, the controller 110 of the DAC 100 may generate a decoded input based on the digital input through
the decoder 111 and generate a control signal based on the
decoded input.

In some implementations, when a particular condition is
satisfied, such as when the uppermost bit of the digital input
is converted from the first value to the second value and all
the other bits other than the uppermost bit of the digital input
are converted from the second value to the first value, the
controller 110 generates a control signal to turn on the
additional segment cell.

In operation S730, the DAC 100 may turn on or off a
plurality of segment cells based on the control signal. The
segment cell circuit 120 of the DAC 100 may generate an
analog output corresponding to the digital input by turning
on or off the plurality of segment cells based on the control
signal.

Figure 8:
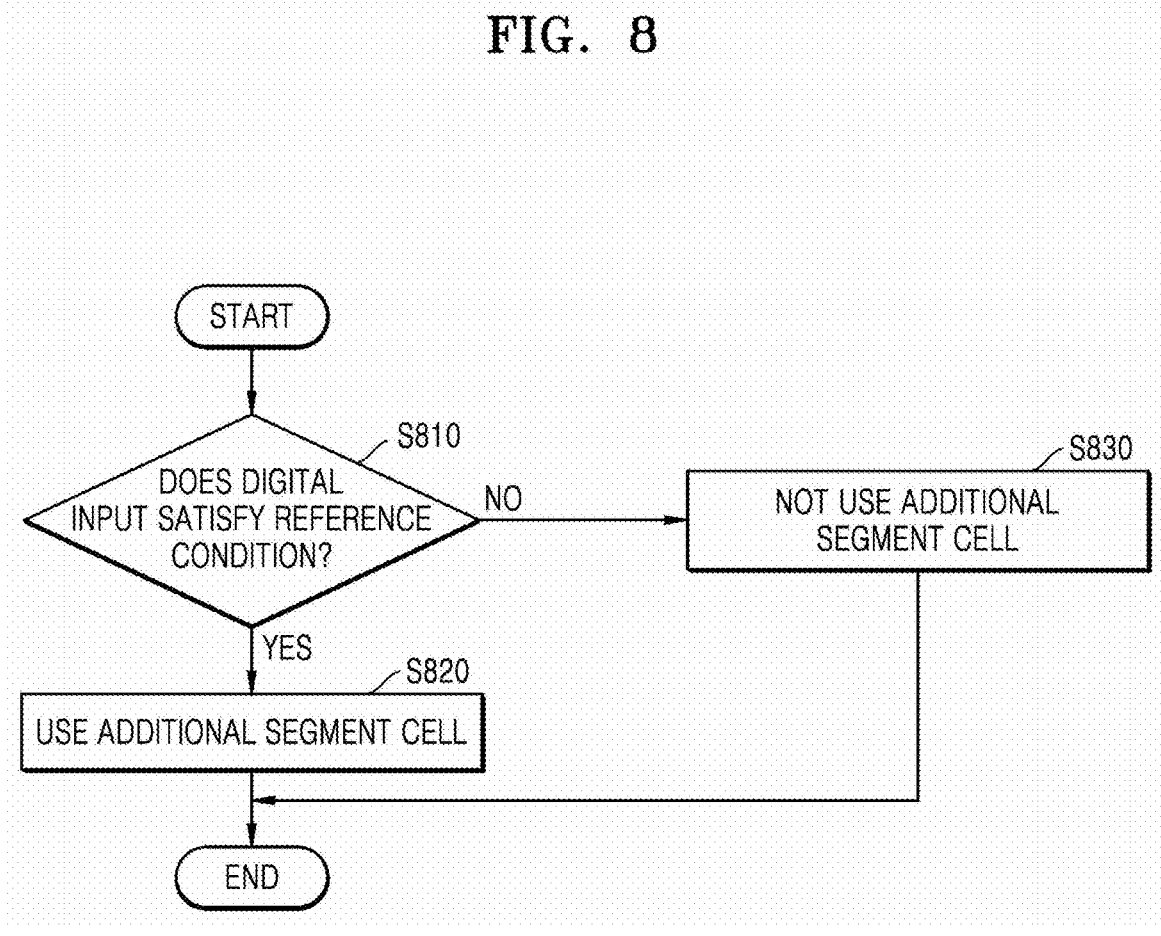
FIG. 8 is a flowchart illustrating an example of an operating method of a detection circuit of a DAC.

FIG. 8 is a flowchart illustrating an operating method of
a detection circuit of a DAC according to some implemen-
tations, e.g., the detection circuit 130.

Referring to FIG. 8, in operation S810, the detection
circuit 130 of the DAC 100 may decide whether the digital
input satisfies a reference condition. After the digital input is
received in operation S710 of FIG. 7, the detection circuit
130 may decide whether the received digital input satisfies
the reference condition. For example, the reference condi-
tion may be whether the scale range of the digital input is
less than or equal to a preset reference size.

When it is decided that the digital input satisfies the
reference condition, the detection circuit 130 may proceed to
operation S820 and determine to use the additional segment
cell.

On the other hand, when it is decided that the digital input
does not satisfy the reference condition, the detection circuit
130 may proceed to operation S830 and determine not to use
the additional segment cell.

Figure 9:
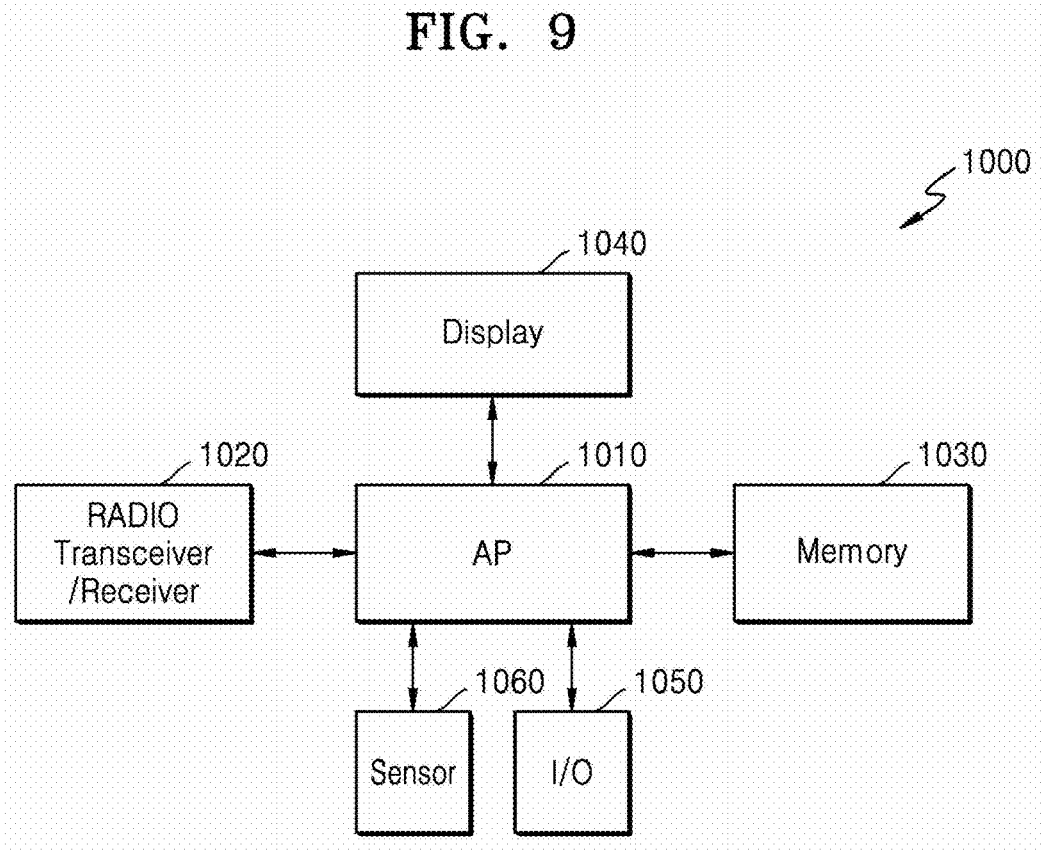
FIG. 9 is a block diagram illustrating an example of an electronic device.

FIG. 9 is a block diagram illustrating an electronic device
according to some implementations.

Referring to FIG. 9, an electronic device 1000 may
include an application processor 1010, a transceiver 1020, a
memory 1030, a display 1040, an input/output device 1050,
and a sensor 1060.

The electronic device 1000 may communicate with the
outside through the transceiver 1020. The transceiver 1020
may include, for example, a wireless short-range commu-
nication interface such as wired Local Area Network (LAN),
Bluetooth, Wireless Fidelity (WiFi), or ZigBee, Power Line
Communication (PLC), or a modem communication inter-
face accessible to a mobile cellular network such as 3rd
Generation (3G), Long Term Evolution (LTE), 5G, NR, or
next-generation communication. The transceiver 1020 may
include the DAC 100 according to any of the implementa-
tions described with reference to FIGS. 1 to 8.

The application processor 1010 may control the overall
operation of the electronic device 1000 and the operation of
the components of the electronic device 1000. The applica-
tion processor 1010 may perform various operations. The
application processor 1010 may include one processor core
(Single Core) or may include a plurality of processor cores
(Multi-Core).

The display 1040 may display internal state information
of the electronic device 1000. The display 1040 may include
a touch sensor. Also, the display 1040 may include an
appearance and an input or output function for a user
interface. A user may control the electronic device 1000
through the touch sensor and the user interface.

The input/output device 1050 may include an input unit
such as a touchpad, a keypad, or an input button and an output unit such as a display or a speaker. The memory 1030 may store instruction code, control data, or user data for controlling the electronic device 1000. The memory 1030 may include at least one of a volatile memory or a nonvolatile memory.

For example, the sensor 1060 may be an image sensor for sensing an image. The sensor 1060 may be connected to the application processor 1010 to transmit generated image information to the application processor 1010. The sensor 1060 may be a biosensor for detecting biometric information. The sensor 1060 may be any sensor such as an illuminance sensor, a sound sensor, or an acceleration sensor.

The electronic device 1000 may include a built-in battery to supply internal power or may further include a power supply unit for receiving power from the outside. Also, the electronic device 1000 may further include a storage device. The storage device may include a nonvolatile medium such as a hard disk (HDD), a solid state disk (SSD), an embedded multimedia card (eMMC), or a universal flash storage (UFS). The storage device may store user information provided through the input/output device 1050 and sensing information collected through the sensor 1060.

At least some of the components of the electronic device 1000, such as the application processor 1010, the transceiver 1020, the memory 1030, the display 1040, the input/output device 1050, and the sensor 1060, may include a DAC for digital-to-analog conversion, and the DAC 100 according to any of the implementations described above with reference to FIGS. 1 to 8 may be used as the DAC.

Figure 10:
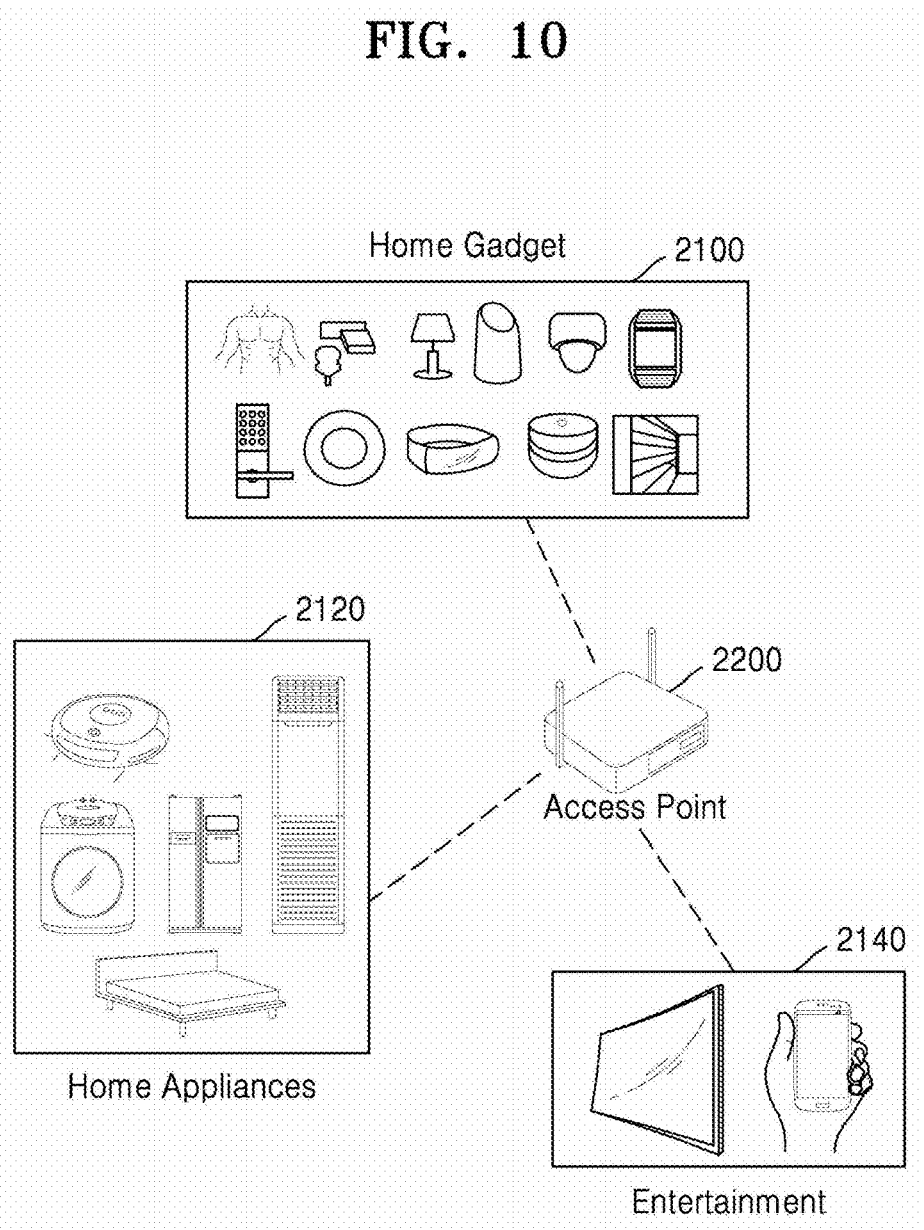
FIG. 10 is a diagram illustrating examples of communication devices including a DAC.

FIG. 10 is a diagram illustrating communication devices including a DAC.

Referring to FIG. 10, each of a home gadget 2100, a home appliance 2120, an entertainment device 2140, and an access point (AP) 2200 may include the DAC 100 according to any of the implementations described above with reference to FIGS. 1 to 8. In some implementations, the home gadget 2100, the home appliance 2120, the entertainment device 2140, and the AP 2200 form an Internet of Things (IoT) network system. The communication devices illustrated in FIG. 10 are merely examples, and other communication devices not illustrated in FIG. 10 may also include the DAC 100 according to any of the implementations described above with reference to FIGS. 1 to 8.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While various examples have been particularly shown and described, it will be understood that various changes in form and details may be made therein without departing from the spirit and scope of this disclosure.

What is claimed is:

1. A digital-to-analog converter (DAC) for generating an analog output from a digital input, the DAC comprising:
   a controller configured to generate a control signal based on the digital input; and a segment cell circuit comprising a plurality of segment cells turned on or off based on the control signal, wherein the segment cell is configured to generate the analog output based on outputs of the plurality of segment cells,
   wherein the plurality of segment cells comprise:
      a plurality of first segment cells, each first segment cell configured to generate a corresponding output based on a corresponding bit included in a first bit group of the digital input;
      a plurality of second segment cells, each second segment cell configured to generate a corresponding output based on a corresponding bit included in a second bit group of the digital input; and
      an additional segment cell configured to generate a corresponding output based on a lowermost bit of the second bit group.

2. The DAC of claim 1, wherein the first bit group includes upper bits, the upper bits including an uppermost bit of bits included in the digital input, and
   wherein the second bit group includes bits not included in the first bit group, wherein the bits not included in the first bit group are lower than the upper bits.

3. The DAC of claim 1, wherein the controller is configured to control the control signal to turn on the additional segment cell based on (i) an uppermost bit of the digital input being converted from a first value to a second value and (ii) all bits of the digital input other than the uppermost bit being converted from the second value to the first value.

4. The DAC of claim 1, wherein the controller comprises a decoder configured to generate a decoded input by decoding bits included in the first bit group of the digital input using thermometer code, wherein:
   the controller is configured to generate the control signal based on the decoded input,
   each of the plurality of first segment cells is configured to generate the corresponding output based on the corresponding bit included in the first bit group of the decoded input,
   each of the plurality of second segment cells is configured to generate the corresponding output based on the corresponding bit included in the second bit group of the decoded input, and
   the additional segment cell is configured to generate the corresponding output based on the lowermost bit of the second bit group of the decoded input.

5. The DAC of claim 4, wherein the decoder is configured to generate the decoded input by decoding bits included in the second bit group of the digital input using the thermometer code.

6. The DAC of claim 1, comprising a detection circuit configured to determine whether the digital input satisfies a reference condition and to determine, based on whether the digital input satisfies the reference condition, whether to use the additional segment cell,
   wherein the controller is configured to generate the control signal based on whether the detection circuit determines to use the additional segment cell.

7. The DAC of claim 6, wherein the reference condition comprises that a scale range of the digital input is less than or equal to a preset reference size.

8. The DAC of claim 6, wherein the detection circuit is configured to:
   determine to use the additional segment cell based on determining that the digital input satisfies the reference condition, and determine not to use the additional segment cell based on determining that the digital input does not satisfy the reference condition.

9. A digital-to-analog converter (DAC) for generating an analog output from a digital input, the DAC comprising:
  a controller configured to generate a control signal based on the digital input; and
  a segment cell circuit comprising a plurality of segment cells turned on or off based on the control signal, wherein the segment cell is configured to generate the analog output based on outputs of the plurality of segment cells,
  wherein the plurality of segment cells comprise:
    a plurality of first segment cells, each first segment cell configured to generate a corresponding output based on a corresponding bit included in a first bit group of the digital input;
    a plurality of second segment cells, each second segment cell configured to generate a corresponding output based on a corresponding bit included in a second bit group of the digital input;
    a plurality of third segment cells, each third segment cell configured to generate a corresponding output based on a corresponding bit included in a third bit group of the digital input; and
    an additional segment cell configured to generate a corresponding output based on a lowermost bit of the second bit group.

10. The DAC of claim 9, wherein the first bit group includes upper bits, the upper bits including an uppermost bit of bits included in the digital input,
  wherein the second bit group includes middle bits of the bits included in the digital input, the middle bits including an uppermost bit of bits not included in the first bit group, and
  wherein the third bit group includes bits, of the digital input, not included in the first bit group and not included in the second bit group, wherein the bits not included in the first bit group and not included in the second bit group are lower than the first bit group and the second bit group.

11. The DAC of claim 9, wherein the controller is configured to control the control signal to turn on the additional segment cell based on (i) an uppermost bit of the digital input being converted from a first value to a second value and (ii) all bits of the digital input other than the uppermost bit being converted from the second value to the first value.

12. The DAC of claim 9, wherein the controller comprises a decoder configured to generate a decoded input by decoding bits included in the first bit group of the digital input using thermometer code, wherein:
  the controller is configured to generate the control signal based on the decoded input,
  each of the plurality of first segment cells is configured to generate the corresponding output based on the corresponding bit included in the first bit group of the decoded input,
  each of the plurality of second segment cells is configured to generate the corresponding output based on the corresponding bit included in the second bit group of the decoded input,
  each of the plurality of third segment cells is configured to generate the corresponding output based on the corresponding bit included in the third bit group of the decoded input, and the additional segment cell is configured to generate the corresponding output based on the lowermost bit included in the second bit group of the decoded input.

13. The DAC of claim 12, wherein the decoder is configured to generate the decoded input by decoding bits included in the second bit group of the digital input using the thermometer code.

14. The DAC of claim 13, wherein the decoder is configured to generate the decoded input by decoding bits included in the third bit group of the digital input using the thermometer code.

15. The DAC of claim 9, wherein the controller is configured to control the control signal to turn on the additional segment cell based on (i) an uppermost bit of the digital input or a decoded input being converted from a first value to a second value and (ii) all bits included in the second bit group of the digital input or the decoded input being converted from the second value to the first value.

16. The DAC of claim 15, wherein the controller is configured to control the control signal to turn on the additional segment cell based on (i) an uppermost bit of the digital input or the decoded input being converted from the first value to the second value, (ii) all bits included in the second bit group of the digital input or the decoded input being converted from the second value to the first value, and (iii) at least a preset reference number of bits included in the third bit group of the digital input or the decoded input being converted from the second value to the first value.

17. The DAC of claim 9, comprising a detection circuit configured to determine whether the digital input satisfies a reference condition and determine, based on whether the digital input satisfies the reference condition, whether to use the additional segment cell,
  wherein the controller is configured to generate the control signal based on whether the detection circuit determines to use the additional segment cell.

18. The DAC of claim 17, wherein the reference condition comprises that a scale range of the digital input is less than or equal to a preset reference size.

19. The DAC of claim 17, wherein the detection circuit is configured to:
  determine to use the additional segment cell based on determining that the digital input satisfies the reference condition, and
  determine not to use the additional segment cell based on determining that the digital input does not satisfy the reference condition.

20. An operation method of a digital-to-analog converter (DAC) for generating an analog output from a digital input, the method comprising:
  receiving the digital input;
  generating a control signal based on the digital input; and
  turning on or off a plurality of segment cells based on the control signal,
  wherein the plurality of segment cells comprise:
    a plurality of first segment cells, each first segment cell configured to generate a corresponding output based on a corresponding bit included in a first bit group of the digital input;
    a plurality of second segment cells, each second segment cell configured to generate a corresponding output based on a corresponding bit included in a second bit group of the digital input; and
    an additional segment cell configured to generate a corresponding output based on a lowermost bit of the second bit group.

* * * * *